United States Patent [19]

Choinski

[11] Patent Number: 4,884,337
[45] Date of Patent: * Dec. 5, 1989

[54] METHOD FOR TEMPORARILY SEALING HOLES IN PRINTED CIRCUIT BOARDS UTILIZING A THERMODEFORMABLE MATERIAL

[75] Inventor: Edward J. Choinski, Wayland, Mass.

[73] Assignee: Epicor Technology, Inc., Wayland, Mass.

[*] Notice: The portion of the term of this patent subsequent to Jun. 7, 2005 has been disclaimed.

[21] Appl. No.: 109,266

[22] Filed: Oct. 15, 1987

Related U.S. Application Data

[62] Division of Ser. No. 935,256, Nov. 26, 1986, Pat. No. 4,748,742.

[51] Int. Cl.⁴ .............................................. H05K 3/02
[52] U.S. Cl. ........................................ 29/846; 156/155; 156/247; 174/66.5; 427/97
[58] Field of Search ............... 29/846, 829, 402.18; 156/155, 247, 309.6, 344; 174/68.5; 427/97, 154, 155

[56] References Cited

U.S. PATENT DOCUMENTS 4,445,952 5/1984 Reynolds, III et al. .
4,522,667 6/1985 Hanson et al. .

FOREIGN PATENT DOCUMENTS 55-36199  9/1980  Japan ..................................... 427/97
56-103497 8/1981  Japan ..................................... 29/829
224631   12/1968  U.S.S.R. ................................. 427/97
2120017  11/1983  United Kingdom ................. 427/97

OTHER PUBLICATIONS

IBM Tech. Discl Bull., vol. 11, No. 7, Dec. 1968 p. 733 by McDermott.
IBM Tech Discl Bull., vol, 12, No. 4, Sep. 1969 p. 512 by Mendola.
IBM Tech Discl Bull., vol. 14, No. 8, Jan. 1972 p. 2459 by Gardner, et al.

Primary Examiner—Howard N. Goldberg
Assistant Examiner—Carl J. Arbes
Attorney, Agent, or Firm—Richard J. Birch

[57] ABSTRACT

A method for temporarily sealing holes in a printed circuit board laminate during processing is disclosed. A sheet of deformable material is placed on one side of the PCB and then deformed so that the material extends into each hole to form a protectively sealing plug therein. Thereafter, the other side of the PCB is coated with a suitable resist for subsequent processing. The resist can be either photo-imagable or non-photo-imagable, such as silk screening inks, lacquers and varnishes. After conventional processing of the resist coated PCB, the deformed sheet material that forms the protectively sealing plugs is removed from the PCB. In the preferred embodiment, deformation of the sheet material is accomplished by thermally deforming a thermodeformable sheet material with a pressure differential applied across the thickness of the sheet material. The thermodeformable sheet material preferably comprises either a low or high density polyethylene of polypropylene that can be re-used many times in order to reduce the material costs of practicing the method of the invention.

102 Claims, 9 Drawing Sheets

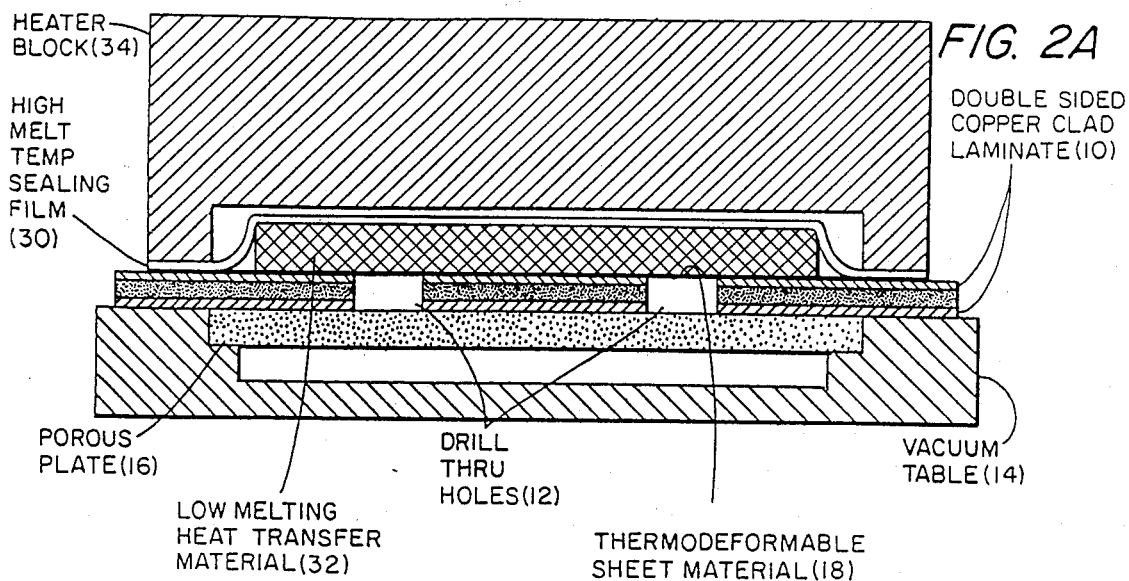
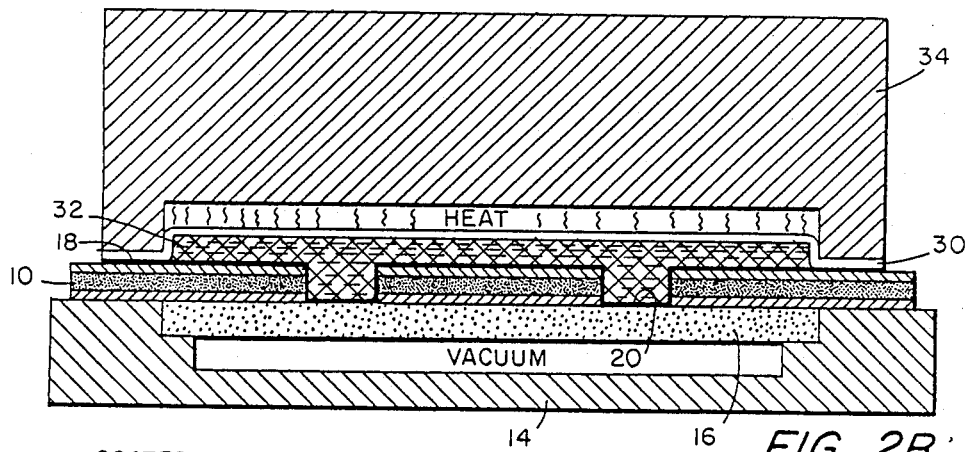
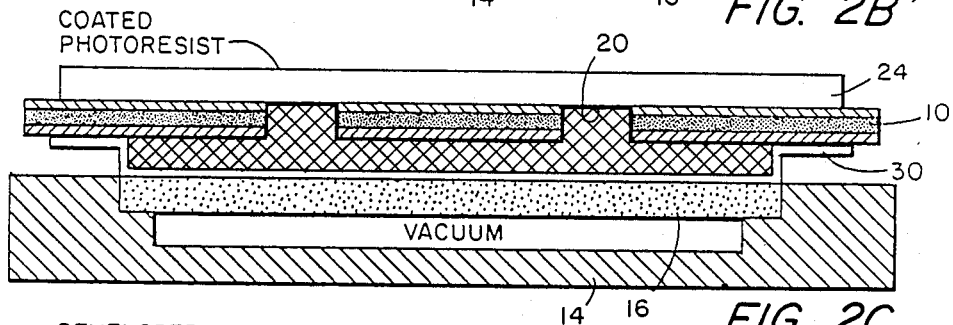
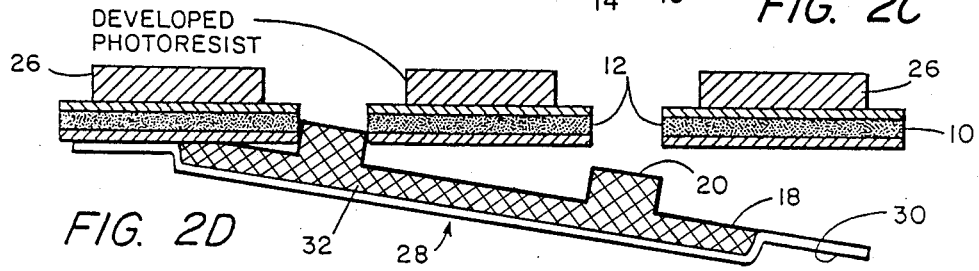

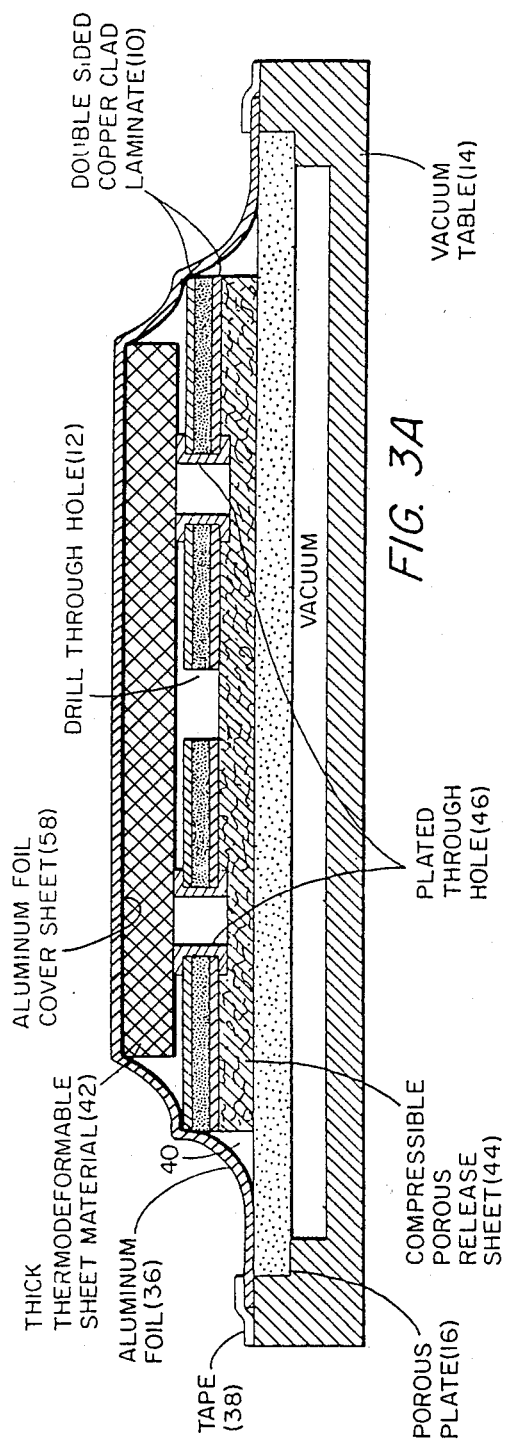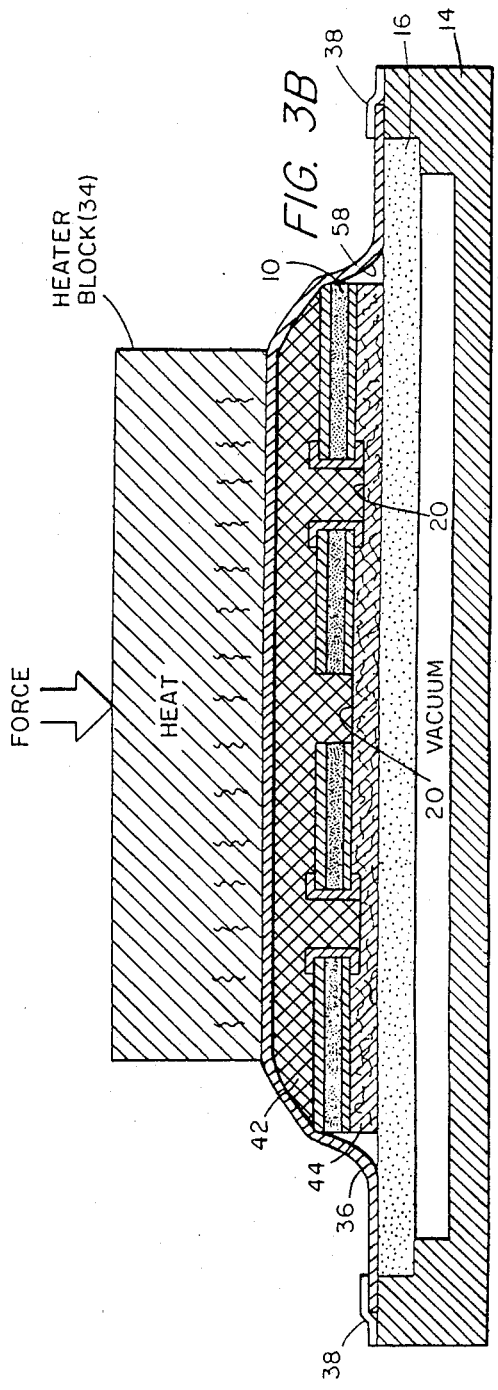

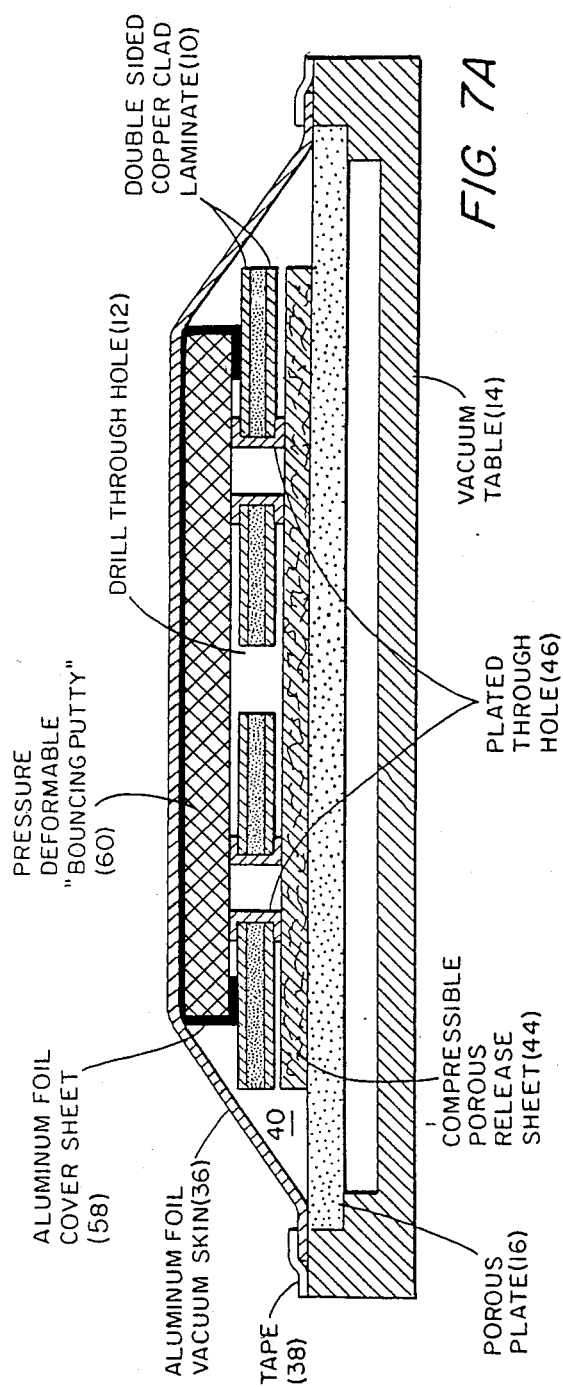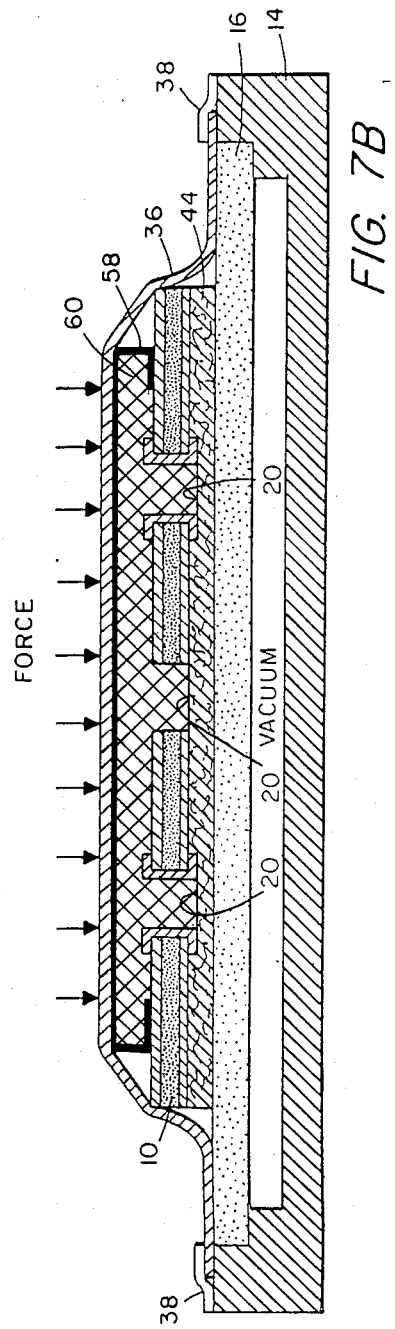
FIG. 7A
FIG. 7B

METHOD FOR TEMPORARILY SEALING HOLES IN PRINTED CIRCUIT BOARDS UTILIZING A THERMODEFORMABLE MATERIAL

CROSS REFERENCE TO RELATED APPLICATION

The present application is a division of applicant's co-pending application, Ser. No. 935,256 filed Nov. 26, 1986, now U.S. Pat. No. 4,748,742 issued Jun. 7, 1988, for "Method For Temporarily Sealing Holes In Printed Circuit Boards" and is related to applicant's co-pending application, Ser. No. 935,255, filed on Nov. 26, 1986 for "Apparatus And Method For Sealing Holes In Printed Circuit Boards", now U.S. Pat. No. 4,700,474 and applicant's co-pending application for "Apparatus And Method For Temporarily Sealing Holes In Printed Circuit Boards Utilizing A Thermodeformable Material", filed simultaneously herewith, which is a continuation-in-part of Ser. No. 935,255 and is incorporated herein by reference.

BACKGROUND OF THE INVENTION

The present invention relates to the manufacture of printed circuit boards and more particularly to a method for temporarily sealing holes in the printed circuit board laminate during processing.

In the manufacture of printed circuit boards, a photoresist is used to transfer the outline of the circuit into the copper surface of the board. The name photoresist defines the dual functioning nature of this material. First it is a photo polymer whose chemical properties are changed by exposure to ultraviolet radiation. That exposure is done selectively through a mask outlining the circuit being defined. The dual functioning comes into play after developing the photo-polymer, where the soft unwanted areas are washed off the copper surface. What remains is a protective covering of hardened polymer only in those areas outlined by the exposure mask. In one application this protective covering resists the etching process so that only the copper left unprotected is etched away. When the resist is finally removed, the protected copper circuit lines underneath become the electrical conductors of the circuit board.

One real measure of the evolution of printed circuit board technology is the width of the copper circuit lines and the spacing between them. As the component density and circuits per square inch increase, the width of the circuit lines and the spaces between them must decrease. The current state of the art is 10 mil lines with 10 mil spaces. This geometry is ultimately determined by the process technology that allows the reliable fabrication of circuit boards within tolerances acceptable to the industry. In normal production a 10 mil wide circuit line can be controlled to within plus or minus 1 mil. If this line is spaced 10 mils from an adjacent line that may also vary by only 1 mil, there is little chance of having broken lines or short circuiting between lines. If, however, that line spacing geometry is reduced to 1 mil lines and spaces, the previous tolerance is unacceptable and the process technology must be advanced to achieve and maintain a tighter tolerance.

The most reliable and efficient method for connecting circuits on opposite sides of a circuit board is the use of the plated through hole. Before the circuit pattern is etched into the copper surfaces of the circuit board, the necessary interconnecting points between the two sides are first located and a hole drilled through the board at that position. In a complex circuit, there may be hundreds of holes each with its own specification and tolerances, making the precision, quality and cleanliness of each drill hole critical. Generally, after the circuit pattern has been defined, a copper conductor is plated inside along the wall of each hole connecting the copper circuits on one side to the other. To provide a good plated connection this hole must be clean and free of any photoresist or other contaminant. The plated connection must be almost perfect because each hole diameter is reduced by the thickness of the copper plating. The remaining hole must be large enough for the leads of the circuit board's components to be inserted into it but not too large to be filled with solder for a final connection.

Two methods are commonly used for applying photoresist to the copper surface of a circuit board. One of these is coating and the other is lamination. In coating, a fluid containing the photopolymer dissolved in solvent is applied to the copper surface in a thin uniform layer. The solvent is evaporated away and a uniform film of photoresist is deposited onto the copper surface. In lamination a previously coated and dried film of photoresist on a carrier web is bonded to the copper surface using heat and pressure, after which the carrier web is stripped away.

Most of the circuit boards produced today use the dry film method primarily for these two reasons. First there is no solvent fluid to cause safety, personnel, environmental or disposal problems. Secondly, there is no liquid photoresist to get inside the drill through holes to contaminate them and jeopardize the integrity of the plated through connections. These two advantages of dry film over coating are substantial but they are obtained at a price. One price is economic as dry film is about three times as costly per square foot as a coated photoresist. The other price, far more costly is technological. Dry film has not been able to be produced reliably below a thickness of one mil. In order to reduce the line spacing geometry so that circuit density can be significantly increased, it is necessary to reduce the thickness of the photoresist to around 0.1 to 0.2 mils. A reliable well adhered photoresist can only be applied in that thickness range by using liquid coating technology. Handling the solvents associated with liquid photoresists has already been solved, however, before any liquid coating technology can be reliably used, the holes in the circuit board laminate must be temporarily sealed.

There are three major problems to be overcome in the temporary sealing of the holes in printed circuit board laminates before they are coated with photoresist. First, the sealing material must prevent any significant amount of photoresist from entering the hole. Secondly, the sealing material must be chemically inert, mechanically rugged and adhered strongly enough to maintain its sealing function during the subsequent processing steps. Finally and most importantly, the sealant material must be completely removed from every hole without leaving any contamination or residue on the hole wall.

Various methods for temporarily sealing the holes have been proposed. Early work described in U.S. Pat. No. 2,965,952 related to filling the holes with an inert material such as a protein substance. As pointed out in this patent, the process of filling and later cleansing of the plated holes was very time consuming and required a plating process in order to insure that the filling material would reside only in the holes and not on the surfaces of the plate. U.S. Pat. No. 2,965,952 attempts to solve the filling and cleansing problem by employing decalcomanias as a resist to the action of the etching solution. The decalomanias comprised a plurality of adhesive-backed strips that extended over the holes in the printed circuit board. This procedure required accurate registration of the protective strips and was also time consuming. U.S. Pat. No. 3,725,215 described a filler masking of small apertures in the printed circuit boards. The process utilized a photo-hardenable material that was placed in the holes with a backing sheet to prevent the material from falling through. After filling the holes, the photo-hardenable material was exposed to radiant energy to solidify it. Again, this process was time consuming and required care that the photo-hardenable material did not extend beyond the perimeter holes themselves.

It is accordingly a general object of the present invention to provide an improved method for temporarily sealing holes in printed circuit board laminates.

It is a specific object of the invention to provide a method for temporarily sealing printed circuit board holes utilizing a deformable sheet material that can be deformed into the holes to form protective sealing plugs therein and that can be easily removed from the printed circuit board after conventional processing of the board.

It is still another object of the present invention to provide a thermodeformable sheet material that can be thermally deformed under a pressure differential established across the thickness of the sheet material to deform the material into the printed circuit board holes.

It is a further object of the invention to provide a cost effective process for temporarily sealing printed circuit board holes in which the sealing material can be re-used a number of times.

It is a feature of the invention that the method can be practiced using commercial, readily available materials.

It is another feature of the invention that the deformable sheet material used in practicing the invention can be re-used a number of times without requiring any additional processing after the deformed sheet material has been removed from the printed circuit board.

BRIEF DESCRIPTION OF THE INVENTION

The method of the present invention solves the three hole filling problems described above by using a deformable sheet material that is deformed to form protectively sealing plugs in each of the holes of the printed circuit board. The deformation of the deformable sheet material is achieved through heat and/or pressure. In one embodiment, a tough, chemically inert, thermodeformable polymer in sheet form is placed against the printed circuit board laminate having holes therein. The temperature of the thermodeformable polymer is raised sufficiently to allow the polymer to deform into the printed circuit board holes to form a protectively sealing plug therein. This is accomplished without thermally stressing the printed circuit board laminate. The deformation of the thermally deformable polymer can be assisted by establishing a pressure differential across the thickness of the polymer.

After deformation of the thermodeformable polymer, its temperature is reduced. The other side of the printed circuit board laminate is then coated with a resist and subsequently processed in a conventional manner. Thereafter, the deformed sheet of thermodeformable polymer is removed from the printed circuit board laminate and, if desired, can be re-used to form protectively sealing plugs in coating the other side of the same circuit board or in another printed circuit board without requiring any additional processing of the deformed thermodeformable polymer sheet.

The above described objects and features of the present invention and other objects will best be understood from a detailed description of a preferred embodiment of the invention, selected for purposes of illustration, and shown in the accompany drawings in which:

FIGS. 2A through 2D illustrate the steps employed in practicing the method of the present invention using a sandwich construction of a high melting point sealing film, an intermediate low melting point heat transfer material and a relatively thin thermodeformable film that forms the protective sealing plugs within the holes of the printed circuit board laminate;

FIGS. 3A through 3D illustrate the formation of the protective sealing plugs using a sandwich construction positioned within a chamber formed between a heater block and a vacuum table containing a flat, porous support plate;

FIGS. 7A–7B illustrate the steps employed in practicing the method of the present invention utilizing a pressure deformable sheet; and, FIG. 8 is a flow diagram illustrating the processing of a printed circuit board laminate after temporarily sealing the holes with the deformable sheet material.

DETAILED DESCRIPTION OF THE INVENTION

Figure 1A:
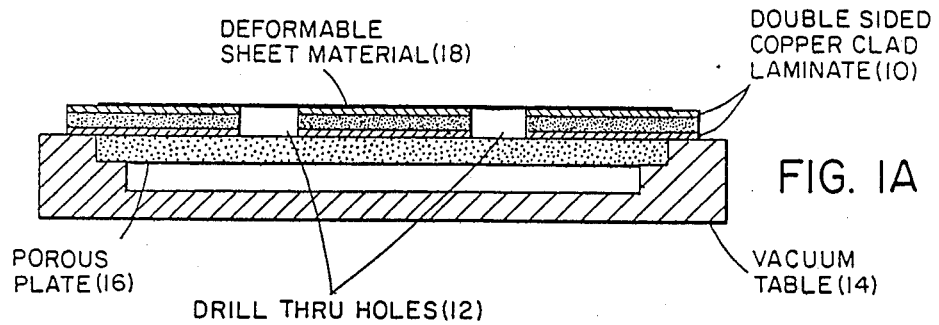
FIGS. 1A through 1E illustrate in a generalized form the steps employed in the present invention to temporarily seal holes in a printed circuit board laminate.
Figure 1B:
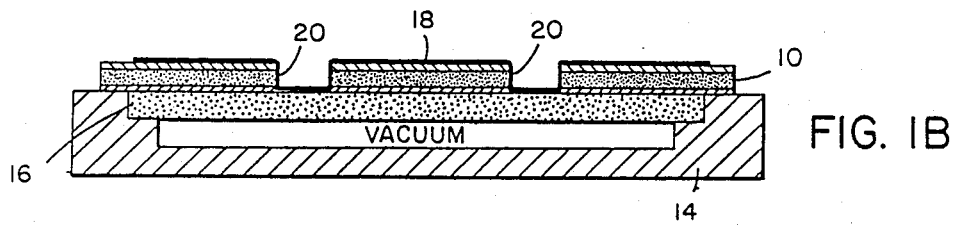

Turning now to the Figures, and specifically FIGS. 1A through 1E, there is shown in generalized form the steps employed in practicing the method of the present invention. A double-sided, copper clad laminate printed circuit board 10 having a plurality of drill through holes 12 is placed on a vacuum table 14 having a flat, porous plate 16. A deformable sheet material 18 is placed in contact with the upper surface as viewed in of the printed circuit board 10. A vacuum is drawn through the porous plate 16 to deform the sheet material down into the drill through holes 12 to form protectively sealing plugs 20 therein as shown in FIG. 1B.

Figure 1C:
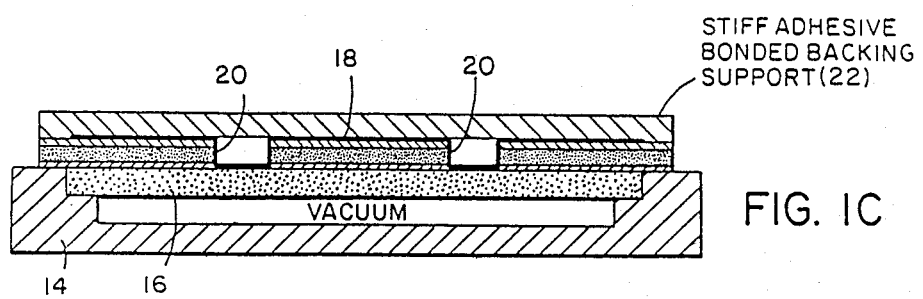
Figure 1D:
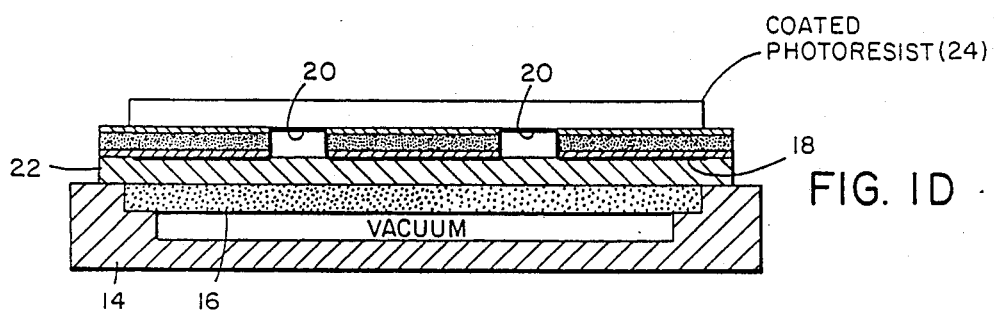
Figure 1E:
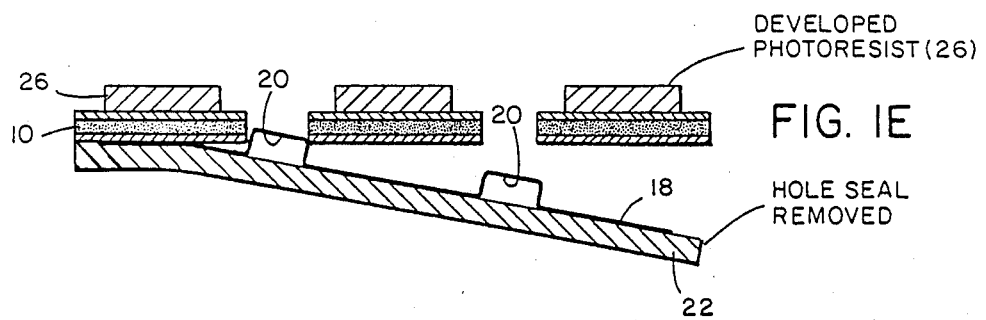

If desired, a relatively stiff, adhesive bonded backing support 22 can be affixed to the deformed sheet material 18 as shown in FIG. 1C. The protectively sealed printed circuit board laminate is turned upside down to expose the side of the printed circuit board laminate that was in contact with the porous plate 16 as shown in FIG. 1D. This side of the printed circuit board is coated with a conventional photoresist 24. After exposure and development of photoresist 24, the deformed sheet material 20 and its support backing 22 are removed from the printed circuit board which now contains developed photoresist 26.

The deformable sheet material 18 can be deformed under pressure, heat or a combination thereof as will be described hereinafter.

Referring to FIGS. 2A through 2D, there is shown the sequential steps of practicing the method of the present invention using a sandwich construction 28 comprising a high melting temperature sealing film 30, a low melting point heat transfer material 32 and the previously mentioned deformable sheet material 18 that constitutes in this case a thermodeformable sheet material. A heater block 34 supplies sufficient heat through the high melting temperature sealing film 30 to melt the low melting point heat transfer material 32. Under the influence of the vacuum supplied by vacuum table 14 through flat, porous plate 16, the thermodeformable sheet material 18 and low melting heat transfer material 32 are drawn down into the drill through holes 12 to form the protective sealing plugs 20 as shown in FIG. 2B. After cooling, the sandwich construction is turned over as shown in FIG. 2C and a conventional photoresist is coated on the now upper surface of the printed circuit board laminate 10. After exposure and development of the photoresist, the sandwich 28 is removed from the printed circuit board laminate 10 as shown in FIG. 2D.

Figure 3C:
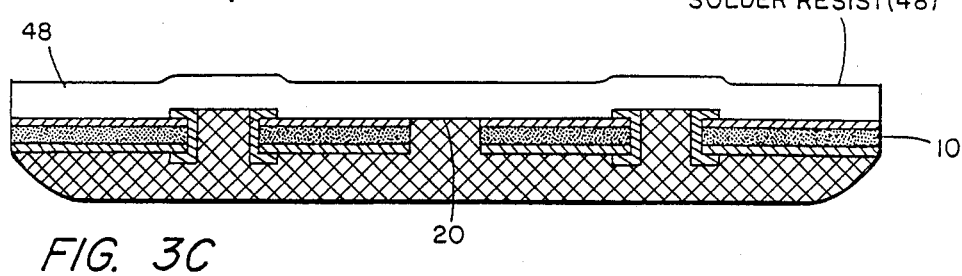

FIGS. 3A through 3D illustrate a different form of sandwich construction of components and their arrangement with respect to the vacuum table 14. Referring to FIG. 3A, a sheet of aluminum foil 36 extends across and is sealed with respect to the vacuum table 14 by a peripheral sealing tape 38. The aluminum foil 36 and the flat, porous plate 16 of the vacuum table together form a chamber 40 within which are positioned in sandwiched relation a relatively thick thermodeformable sheet material 42 that is in contact with one side of the printed circuit board laminate 10. If desired, the surface of the thermodeformable sheet material 42 in contact with the PCB or the surface of the PCB itself can have a release agent applied thereto by spraying, coating, etc. before the sheet material is placed in contact with the PCB. The other side of the printed circuit board laminate is in contact with a compressible porous release sheet 44 such as tissue paper. As shown in FIG. 3A, the double sided copper clad laminate printed circuit board 10 has a drill through hole 12 and two plated through holes 46.

The relatively thick thermodeformable sheet material 42 comprises a tough, chemically inert thermodeformable polymer that is usually less than the thickness of the copper clad laminate. The thermodeformable sheet material can be either thermoplastic or thermoset depending upon the chemical and mechanical properties desired and whether or not the material is to be re-used. If the material is to be used more than once, a thermoplastic polymer is generally selected.

One step in the sealing process is to pull a vacuum through the porous plate to remove the air from within chamber 40. Drawing the vacuum causes the flexible aluminum foil 36 to pull down and apply a force to the top of the thermodeformable sheet material 42. This force is transmitted to the copper clad laminate pressing it against the porous release sheet 44 compressing it and allowing it to conform to the irregular surface of the laminate as shown in FIG. 3A.

In another step, a temperature controlled heater block 34 raised to a predetermined temperature usually above the melting or flow point of the thermodeformable material is brought into contact with the sandwich.

In addition to, or in place of, the vacuum force, an external force can be applied to the heater block which also presses the copper clad laminate against the compressed porous release sheet. The heat is transmitted through the aluminum foil to raise the temperature of the thermodeformable material to at least its VICAT softening point. The softened polymer flows, pulled by the vacuum force, into the holes of the copper clad laminate up against the compressed porous release sheet as shown in FIG. 3B. The compressed porous release sheet 44 seals the edges of the printed circuit board holes controlling the amount, if any, of the now softened polymer from leaking past the hole to the underside of the laminate. The viscosity of the softened polymer is reduced by increasing its temperature so that it flows sufficiently to fill in all of the irregularities in the wall of the hole. The viscosity is high enough, however, so that the polymer does not wick through the compressed release sheet 44, but instead only penetrates slightly into its surface. This configuration can best be seen in the enlarged view of FIG. 4 in which the planar surface 52 of the laminate 10 is in contact with the compressed release sheet or tissue paper 44. It can be seen in FIG. 4 that the polymeric plug 20 has a slight concave surface 54 in contact with the release sheet 44. The release sheet helps control the amount of underside seepage 56 of the thermodeformable material between the release sheet 44 and the planar surface of the laminate 52.

After a sufficient period of time the heater block is removed and the entire structure is allowed to cool to room temperature. The aluminum chamber foil 36 is then peeled off the solidified polymer on one side of the structure and the porous compressible release sheet is stripped away from the underside of the laminate. If desired, a thin, protective, thermally conductive cover sheet 58 of aluminum foil, stainless steel or other thermally conductive material can be placed between the thermodeformable sheet material and the chamber forming aluminum foil 36 to prevent the thermodeformable polymer from adhering to the chamber foil 36. This optional cover sheet element is shown in FIGS. 3A and 3B. The selection of the material for the protective, thermally conductive cover sheet 58 is governed by its need to resist subsequent processing operations if it is allowed to remain bonded to the thermodeformable material.

What remains is a circuit board laminate whose entire surface on one side is protected by the polymeric material. On the other side of the laminate all the holes are filled to the top with that same polymeric material.

In the manufacture of printed circuit boards not only are photoresists used temporarily in the process to define the circuit pattern as described previously, but also to provide a permanent protective mask over all the circuitry except in those areas around the plated through holes 46 where solder must be allowed to wick though to make component connections.

Currently this solder resisting mask is usually applied using a silk screen technique where the proper combination of screen pattern, registration and fluid flow characteristics are required to print the mask without allowing any masking material to enter a hole. If masking material enters a hole it is usually very difficult to remove it completely generally resulting in a poor solder connection. In critical applications or when circuit density is increased and hole patterns are close together, silk screening cannot maintain the tolerance needed to prevent masking material from entering the holes. Here a very expensive dry film solder masks is used. In very dense circuitry with close line spacings, however, the dry film solder mask because it is laminated with heat and pressure, cannot displace all the air between the circuit lines. These air pockets trapped beneath the laminated dry film prevent it from bonding to the circuit board. After subsequent processing and with time these areas have a tendency to crack and flake off exposing the circuit board surface. Ciba-Geigy has brought to the market a photo-imagable liquid solder resist that is coated onto the laminate and dried. It relies on the increased viscosity of the coating fluid and a complicated curtain coating technique to keep the coated solder resist from filling the holes. While it may stop the solder resist from filling all of the hole, it does not prevent it from filling part of the hole. See U.S. Pat. No. 4,230,793.

Figure 3D:
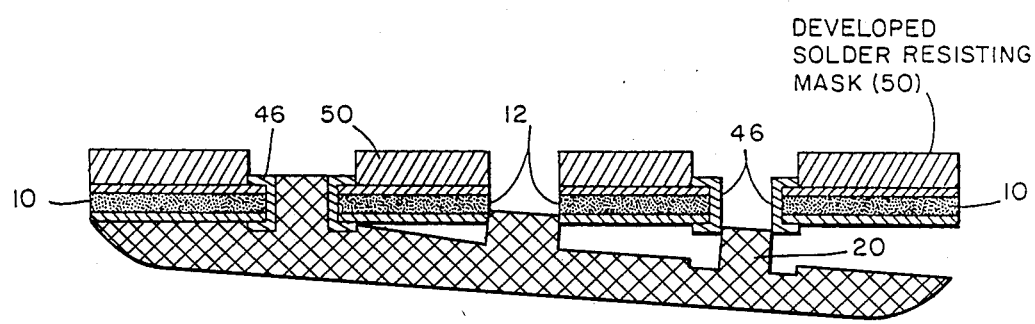

With the holes plugged as described in the present application, any liquid photo-imagable solder resist of any viscosity, can be coated using any coating techique, without concern for contaminating the plated through holes as shown in FIG. 3C. After drying, the coated photo-imagable solder resist 48 is exposed and developed to produce a solder resisting mask 50, as shown in FIG. 3D that exposes the hole for the introduction of solder. Since the circuit board has been essentially completed when it reaches the solder mask operation, the investment in time and materials is high. Having only one hole that does not solder properly can cause the board to be rejected or fail while in service. As circuit board density increases and the size and spacing of the plated through holes decreases, the registration of silk screening becomes almost impossible to prevent solder mask from entering the hole or covering the pad surrounding it. Only with a photo-imagable solder resist can a solder mask be accurately applied over high density circuits.

The following examples describe in detail the materials, equipment, and processing parameters used to practice the method of temporarily sealing the holes in a copper clad printed circuit laminate:

EXAMPLE 1 a. A sample of double sided copper clad laminate, 0.062 inch thick, containing holes of varying diameters was selected to have these holes temporarily sealed using the process described by this invention.

b. The laminate sample was placed on top of tissue paper which rested on top of a flat, porous plate set into a vacuum table.

c. A sheet of high density polyethylene, 0.03 inch nominal thickness, was placed on top of the laminate covering the holes to be sealed.

d. A piece of Reynolds extra heavy duty aluminum foil was placed on top of the high density polyethylene, made large enough so that it extended beyond the perimeter of the polyethylene sheet.

e. A piece of Reynolds extra heavy duty aluminum foil was placed over the structure described above and taped to the vacuum table along its edge with duct tape, as depicted in FIG. 3A, to form a flexible vacuum chamber.

f. A vacuum pump was connected to the vacuum table. The vacuum pump was capable of pumping out the air from underneath the flexible aluminum foil chamber until a vacuum of 25 inches of mercury registered on a gauge connected to the vacuum table.

g. An aluminum block was heated until it reached a temperature of 750° F. as indicated on a thermometer probe inserted into a hole drilled in the aluminum block.

h. The heated aluminum block was then placed on top of the aluminum foil vacuum chamber, resting on the structure within it.

i. The heated aluminum block was allowed to sit in this position for 60 seconds. A vacuum of 25 inches of mercury was applied to the inside of the aluminum foil chamber as described in step f.

j. After the 60 second contact time had elapsed, the aluminum block was lifted off the structure and the structure cooled.

k. When the structure reached room temperature, the duct tape and aluminum foil of steps e and f were removed thereby exposing the foil covered, solidified polyethylene on one side of the laminate. The tissure paper was removed from the other side of the laminate.

Figure 4:
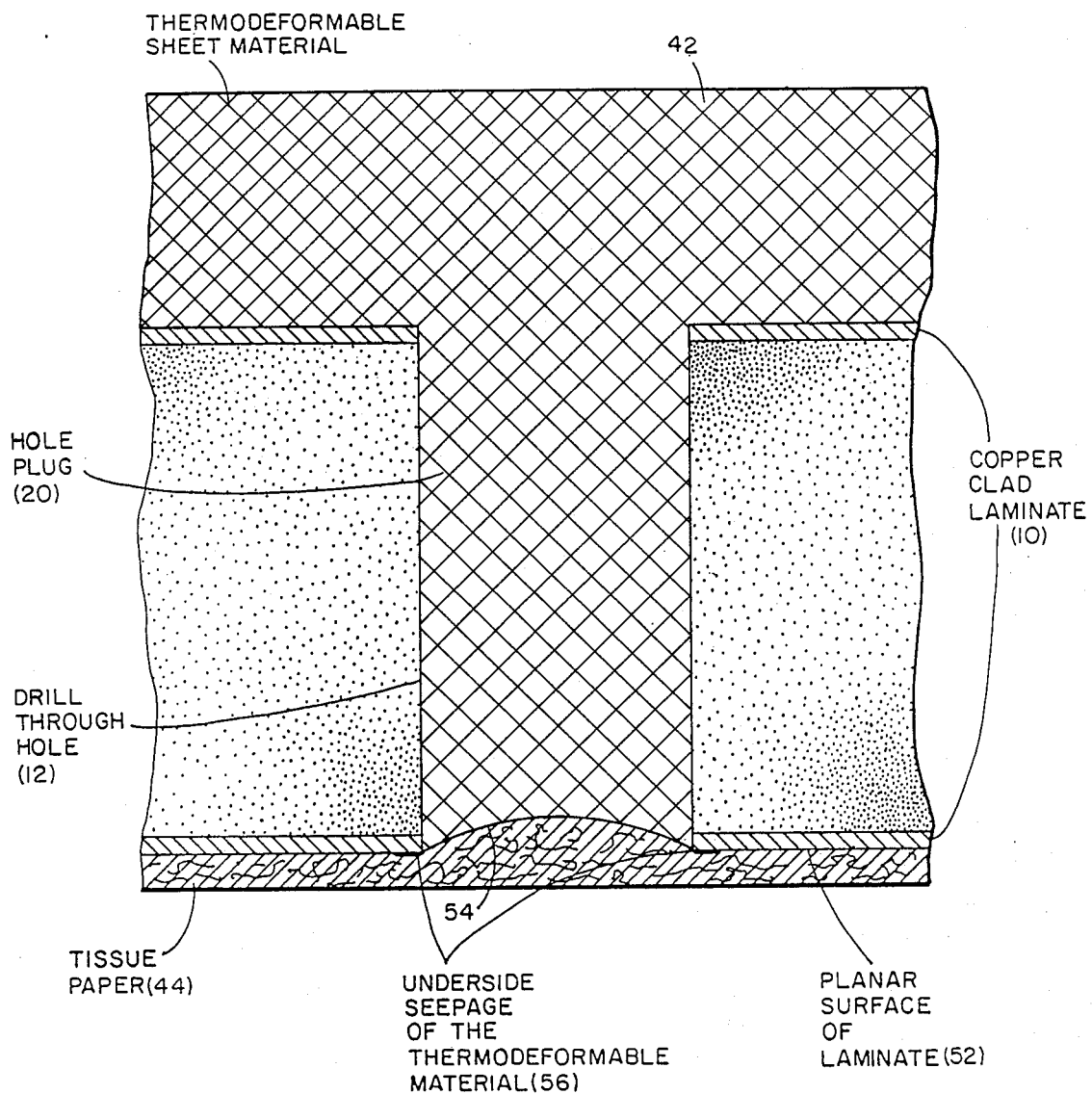
FIG. 4 is an enlarged cross-sectional, pictoral view of a single printed circuit board hole having a protective sealing plug formed therein and illustrating the use of a compressible porous release sheet to minimize seepage beyond the perimeter of the printed circuit board hole.

Inspecting the side of the laminate which rested against the tissue paper revealed that all the holes directly under the sheet of polyethylene had been filled with polyethylene plugs. Closer inspection with a magnifier revealed that the tops of the plugs were not planar to the laminate's surface but slightly concave. This was probably caused by the fact that the tissue paper directly under the hole was not compressed as much as that near the edges of the hole causing it to bow in past the planar surface of the laminate into the hole. (FIG. 4). Although the centers of the holes were not completely filled to the planar surface of the laminate, the edges around the hole were filled to the surface, even to the extent that a very small amount of thermally deformed polyethylene pushed past the tissue paper seal to the underside of the laminate (FIG. 4). This small amount of underside seepage around the periphery of the hole indicated that thermally deformed polyethylene had flowed up against the sides of the holes forming a good seal.

To test the effectiveness of the polyethylene seal in the holes, a polyvinyl alcohol (PVA) solution was spread over one half of the laminate's surface covering the plugged holes. The other half was coated with Kodak KPR photoresist. Both coatings were dried. Unlike the photoresist, however, the dried PVA film does not adhere strongly to the laminate surface and can be stripped away intact. The side of the PVA coating that was up against the surface of the laminate then provides a positive replication of where the liquid had penetrated and dried. Inspection of the PVA replicate revealed that the holes were effectively sealed by the polyethylene plugs.

The final test of the polyethylene seal was how easily and cleanly it could be removed. By grabbing a corner of the foil covered polyethylene sheet covering the back of the laminate and pulling it away at a right angle to the laminate's surface, the polyethylene sheet and the sealing plugs attached to it popped out of the holes and pulled cleanly away from the laminate's surface. Inspection of the copper clad laminate's surface and holes revealed no residue of the polyethylene sealing material. In addition, on that half of the laminate that had been coated with the Kodak KPR photoresist, it was observed that the photoresist coating "tented" over the holes.

EXAMPLE 2

The foil covered polyethylene sealing sheet that was removed from the laminate sample in Example 1 was used to seal the holes in another copper clad laminate. The procedure used was similar to that described in Steps a through k of Example 1. The aluminum foil cover sheet, however, did not have to be added in Step d since it was already bonded to the polyethylene. Again a satisfactory seal was observed.

EXAMPLE 3

A double sided copper clad laminate containing holes of varying diameters was selected to have these holes temporarily sealed using the process of this invention. A sheet of low density polyethylene was used along with a procedure similar to that described in Steps a through k of Example 1. A satisfactory seal was observed.

EXAMPLE 4

A double sided copper clad laminate having holes of varying diameters was selected to have these holes sealed using the process of this invention. A sheet of polypropylene was used along with a procedure similar to that described in Steps a through k of Example 1. A satisfactory seal was observed.

Figure 5:
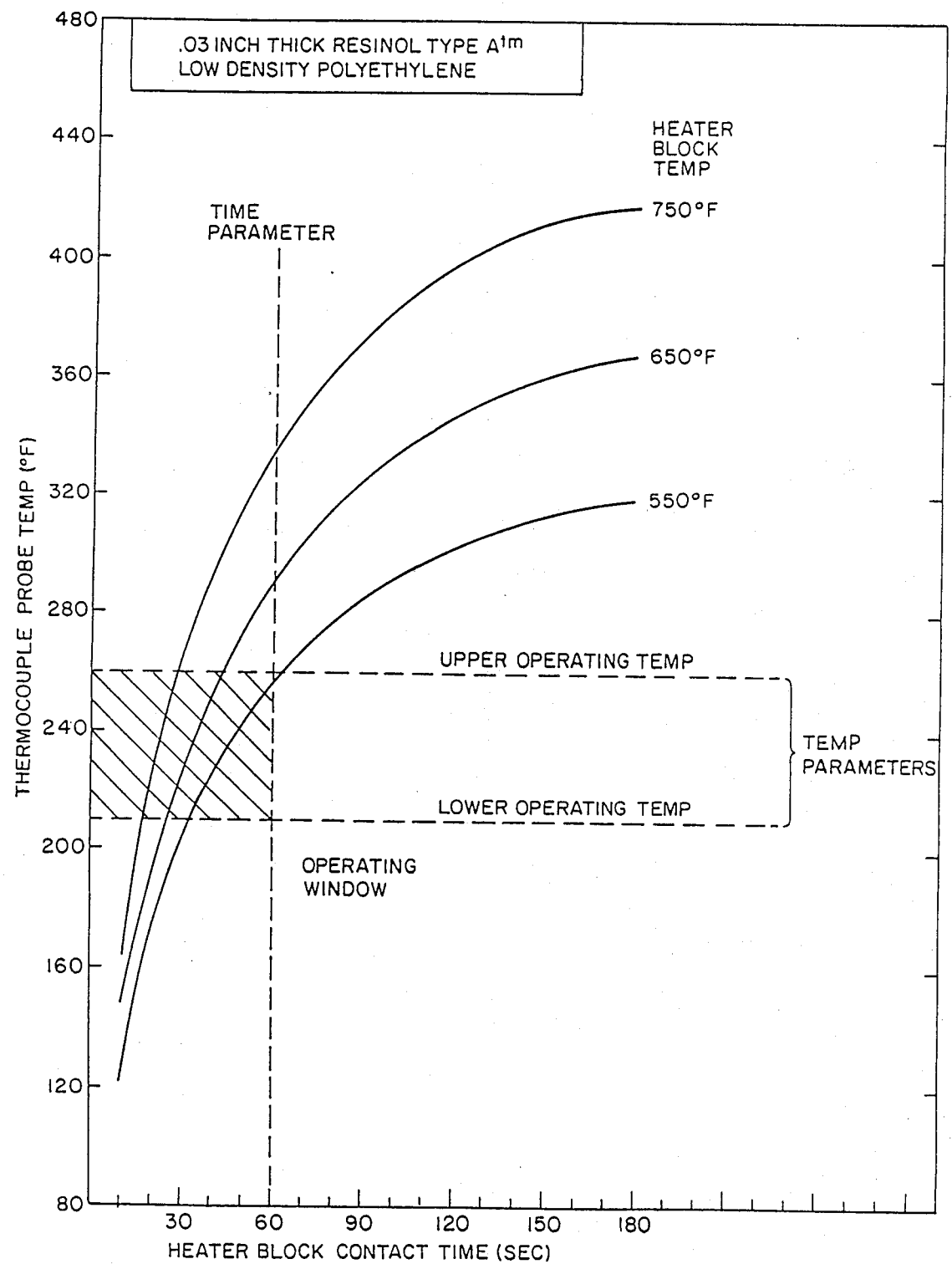
FIG. 5 is a time-temperature plot showing a representative operating window for a low density polyethylene thermodeformable sheet material; and, FIG. 6 is a time-temperature plot for a high density polyethylene thermodeformable sheet material.
Figure 6:
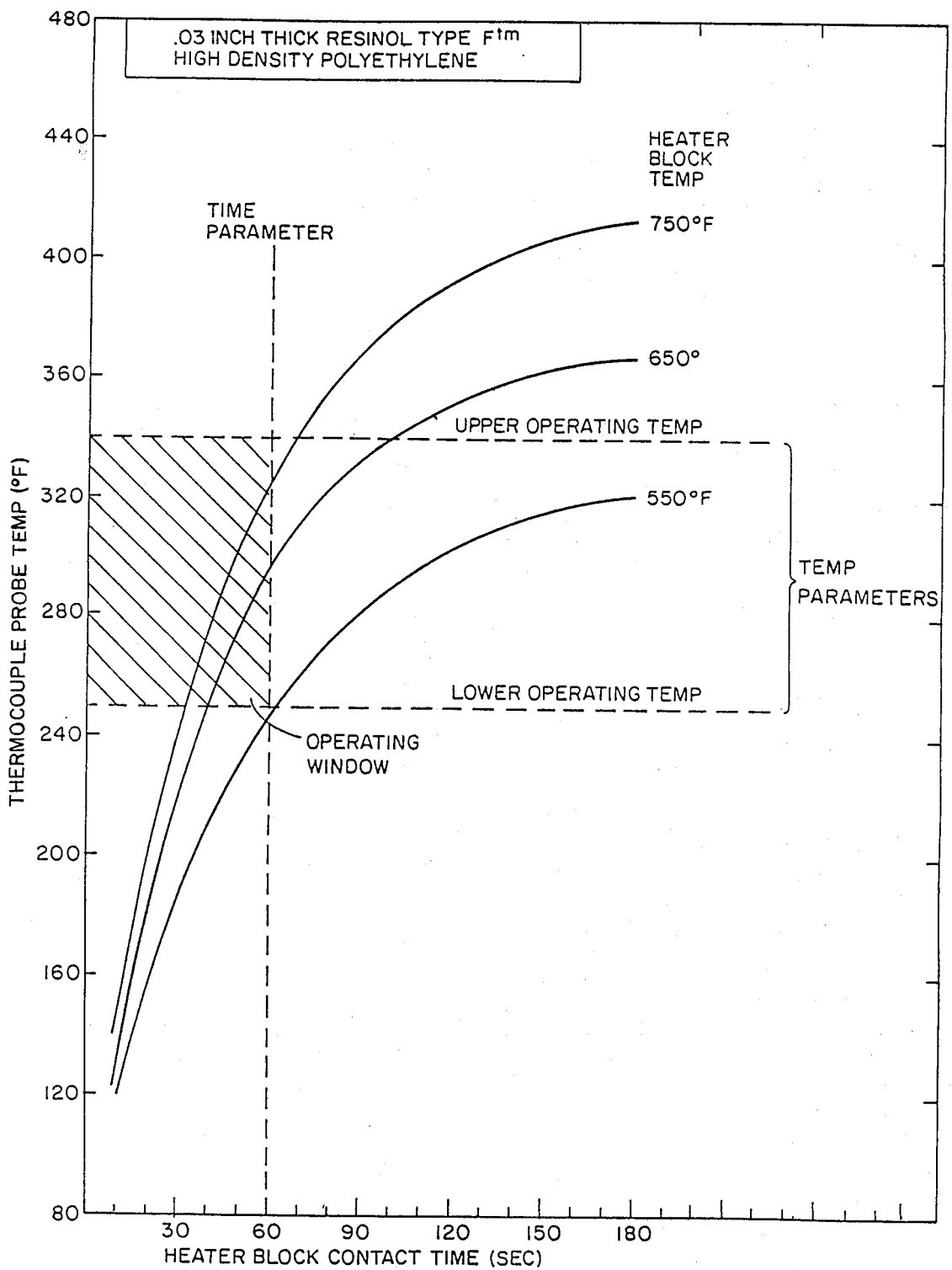

Having described in detail the above examples of the method of my invention, it will be appreciated that a variety of materials can be used as the deformable sheet material in the practice of the invention. FIGS. 5 and 6 illustrate by means of a time-temperature diagram the operating parameters for a low density polyethylene (FIG. 5) and a high density polyethylene (FIG. 6) in the process of FIGS. 3A-3D. A surface thermocouple probe was inserted through a hole in the vacuum table, porous plate, release sheet, and PCB laminate so that its measuring tip was coplanar with the upper laminate surface to measure the temperature of the thermodeformable sheet material at that laminate surface. The low density polyethylene is Allied Resinous Products, Inc. Resinol Type A ™, while the high density polyethylene is Resinol Type F ™.

The "operating window" shown by the diagonally shaded lines in FIGS. 5 and 6 is established by selecting certain time and temperature parameters. The temperature parameters were established to insure that the printed circuit board laminate was not thermally stressed and that the polyethylene in contact with the PCB reached at least the VICAT softening temperature of the polyethylene. Since the cycle time of the process has a significant impact on the cost of the process, a heater block contact time of 60 seconds was chosen. Thus, within the parameter of a 60 second heater block contact time and the previously mentioned temperature parameters, the operating window was defined for each form of polyethylene. It can be seen from FIGS. 5 and 6 that the rate of heat transfer to a surface, e.g., the circuit board laminate (or other surface) can be controlled using the thermodeformable material, e.g., the high or low density polyethylene, as a regulating heat transfer medium.

Three heater block temperatures are plotted in each of FIGS. 5 and 6. In FIG. 5, either or other heater block temperatures can be employed to stay within the desired operating window. In the case of FIG. 6, the heater block contact time must be increased to approximately 65 seconds if the heater block is run at a temperature of 550° F. It will be appreciated by those skilled in the art that the operating window will be changed by adjusting the variables of heater block contact time, the temperature parameters, the heater block temperature itself and the material used as the thermodeformable sheet material and any forces applied thereto.

For certain operations, the upper operating temperature, i.e., the temperature of the thermodeformable sheet material in contact with the printed circuit board laminate, is constrained by the time temperature limitations of military specification, MIL-P-13949F, of 10 Mar. 1981 entitled "Plastic Sheet, Laminated, Metal Clad (for printed wiring boards), General Specification". Similarly, the "VICAT" softening temperature of the thermodeformable plastic is defined by ASTM designation: D1525-82. The plastic materials that can be selected for use as the thermodeformable sheet material 18 are selected from the plastics listed in Modern Plastics Encylcopedia, 1984-85, pp. 450-481. Each of the documents set forth above is incorporated herein by reference.

Although the preceding discussion has focused on the use of a thermodeformable sheet material, such as a plastic or paraffin, it will be appreciated that other deformable materials in sheet form can be used to practice the method of the invention. Specifically, a pressure deformable material can be used to temporarily seal holes in a copper clad laminate. A suitable pressure deformable material is known as "bouncing putty" or "silly putty". This material is described in General Electric Silicon Products Data SS-91 "Silicon Putty" Revision A and in "Silicon Under The Monogram", by Herman A. Liebhafsky, John Wiley Interscience, Copyright, 1978, pp. 142-143 and 237-239. These references are incorporated herein by reference.

When the "bouncing putty" is subjected to external elongational or sheer forces that act on it over a long period of time, (generally greater than one second) the putty is plastic and will yield, flow, deform and conform to any shape. When those forces are removed, the material generally maintains the last shape induced. If the putty, however, is subjected to those same forces over a significantly shorter period of time, (generally less than a second), the molecular structure of the material causes it to act like a stiff, non-flowing, rubbery substance with a variable elastic modulus and yield point which if exceeded rapidly enough will cause the material to break or shatter.

FIGS. 7A and 7B illustrate the practice of the method of the present invention utilizing a pressure deformable sheet material 60 which is formed from a quantity of bouncing putty. The reference numerals used in FIGS. 7A and 7B are the same as the reference numerals used in FIGS. 3A and 3B for corresponding components.

The sheet of pressure deformable "bouncing putty" 60 is placed in sandwich relation starting at the bottom with the compressible porous release sheet 44, the printed circuit board laminate 10, the bouncing putty itself and an aluminum foil cover sheet 58 as shown in FIG. 7A. Thereafter, a vacuum is drawn to deform the pressure deformable bouncing putty 60 into the holes in the printed circuit board laminate under the force created by the vacuum as shown in FIG. 7B.

As an example of using "bouncing putty" to temporarily seal holes in a printed circuit board, the following test was performed:

A quantity of the "silly putty", sold by Binney & Smith, Inc., was formed into a flat sheet one-eighth of an inch thick by four inches square. The sheet was then covered with aluminum foil on one side, with the foil extending around the edges and covering one-half inch around the periphery of the other side.

A copper clad laminate with holes in it was placed on top of a piece of tissue paper which rested on top of a flat, ceramic, porous plate set into a vacuum table. The foil covered putty was placed on top of the laminate with the exposed putty against the laminate, covering the holes to be sealed.

A piece of heavy duty aluminum foil was placed over the structure of tissue paper, copper clad laminate, and putty, and taped to the vacuum table along its edges with duct tape to form a flexible vacuum chamber. A vacuum pump connected to the vacuum table was turned on pumping out the air from underneath the flexible aluminum foil chamber until a vacuum of 25 inches of mercury registered on a gauge connected to the pump.

The vacuum force pulled the flexible aluminum foil vacuum skin against the sheet of putty forcing it against the copper clad laminate. The vacuum was maintained for a period of 60 seconds. During this time, the putty deformed slowly, flowing down into the holes of the laminate up against the tissue paper beneath it. When the vacuum was turned off, the vacuum skin removed, and the tissue paper stripped away from the laminate, it was observed that all the holes directly under the putty had been completely filled with putty to the planar surface of the laminate.

In repeating the procedure described above using the same sample of "silly putty" used previously, instead of sealing the structure with the aluminum vacuum skin, a four inch square, one inch thick aluminum block was placed on top of the structure. A force of 200 pounds was then applied to the structure for a period of 60 seconds. No vacuum was applied. When the force was removed and the tissue paper stripped away, it was again observed that all the holes directly under the putty had been completely filled by the putty. In both this case and that described previously, the temperature of the putty and the apparatus were at an ambient temperature of 78° F.

To remove the plugs of putty from the holes in the laminate it required several trials to get a feel for the correct pull. By grasping a corner of the foil covered putty sheet, the sheet is pulled away at a 90° angle to the laminate. If the sheet is pulled too slowly, the long time constant causes the putty to flow. Consequently, where the plug connects to the main sheet it necks in, stretches and breaks away from the main sheet leaving the plug left in the hole. If the sheet is pulled too quickly, the time constant causes the material to become rigid setting up a low yield point which causes the plug to snap away from the main sheet when the yield point is exceeded. Again this leaves the plug remaining in the hole. The correct rate of pull allows the material to become rigid enough so that when the main sheet is pulled away, the plugs do not exceed their yield point, and are pulled out of the holes attached to the main sheet. The time to strip away the samples described above is somewhere around ½ second.

Figure 8:
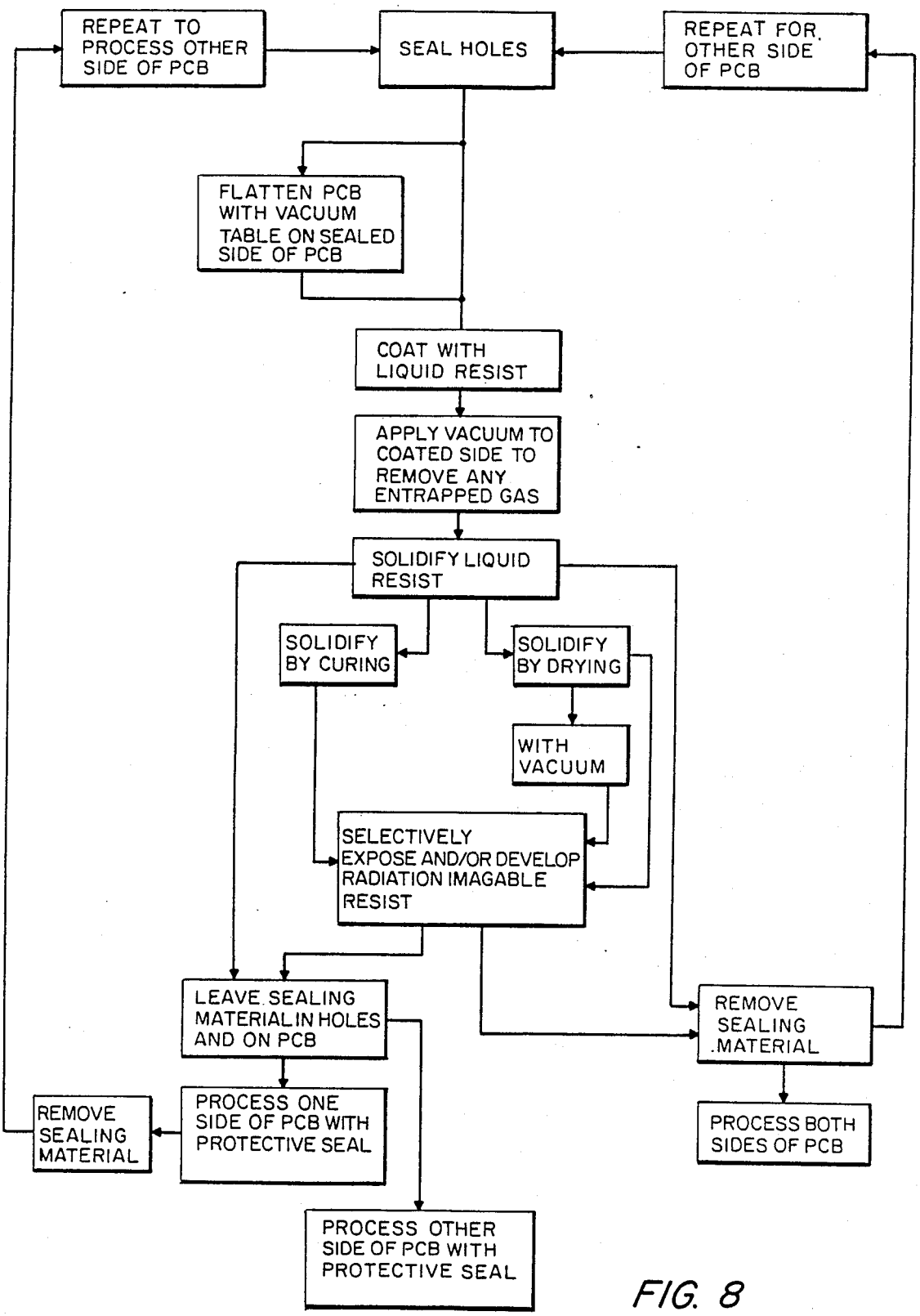

Turning now to FIG. 8, there is shown in flow diagram form the use of a printed circuit board laminate having the holes therein sealed by the method described above. Starting at the top of FIG. 8, the holes in the printed circuit board laminate are sealed and, if desired, the sealed printed circuit board can be flattened by placing the board on a vacuum table with the sealed side of the PCB laminate in contact with the vacuum table. If the PCB laminate does not have to be flattened, it can be directly coated with a liquid resist.

The application of a liquid resist coating to a printed circuit board laminate often creates entrapped gas either within the liquid resist itself or under the resist. By applying a vacuum to the resist coated side of the printed circuit board, any such entrapped gas can be removed to provide a uniform resist coating that tightly conforms to the configuration of the PCB laminate and any circuitry thereon. Thereafter, the liquid resist is solidified either by curing or drying. At this point there are a number of options.

As shown in the right hand side of FIG. 8, the solidified liquid resist coated printed circuit board laminate can have its sealing material, e.g., the pressure deformed or thermodeformable sheet material, removed from the printed circuit board laminate. The previously described process is then repeated for the other side of the printed circuit board. After coating and solidification of the liquid resist on the other side of the printed circuit board laminate, the sealing material is removed and both sides of the printed circuit board are processed together in a conventional manner.

Alternatively, as shown on the left hand side of FIG. 8, the sealing material, e.g., the pressure or thermally deformed sheet material, can be left in the holes on the printed circuit board laminate. Processing is accomplished on one side of the printed circuit board laminate with the protective seal of the sheet material remaining in place. Thereafter, the protective sealing material of the thermodeformed or pressure deformed sheet material is removed and the process from the top of FIG. 8 is repeated with respect to the other side of the printed circuit board as shown in FIG. 8. Finally, the other side of the printed circuit board is processed with the protective seal of the deformed sheet material in place after which the protective seal is removed.

If the resist is radiation imagable, the coating of liquid resist is solidified by selective curing or drying and, in the latter case, drying can be aided by a vacuum. Selective exposure and/or development are performed in a conventional maner and the developed resist coated PCB laminate is treated in a manner described above and shown in FIG. 8.

Having described in detail a preferred embodiment of my invention, it will be apparent to those skilled in the art that various modifications can be made therein without departing from the scope of the invention as described in the appending claims:

What I claim is:

1. A method for temporarily sealing holes in a printed circuit board during processing of the printed circuit board, said method comprising the steps of:
   A. placing a sheet of deformable material on one side of a printed circuit board having holes therein;
   B. deforming said sheet material so that the material extends into each hole to form a protectively sealing plug therein;
   C. coating the other side of the printed circuit board with a process fluid;
   D. processing the printed circuit board; and, thereafter,
   E. detaching the deformed sheet material from the printed circuit board.

2. The method of claim 1 further comprising the steps of repeating at least once steps A through E using the deformed sheet material of step E as the deformable material of step A.

3. The method of claim 1 wherein said deformable sheet material is deformed by establishing a pressure differential between pressures on opposite sides of the deformable sheet material.

4. The method of claim 3 wherein said pressure differential is established by applying a vacuum to the other side of said printed circuit board.

5. A method for temporarily sealing holes in a printed circuit board during processing of the printed circuit board, said method comprising the steps of:
   A. placing a sheet of thermodeformable material on one side of a printed circuit board having holes therein;
   B. deforming said thermodeformable sheet material at least in part by applying heat to the thermodeformable sheet material for sufficient time so that the material extends into each hole to form a protectively sealing plug therein;
   C. coating the other side of the printed circuit board with a process fluid;
   D. processing the printed circuit board; and, thereafter,
   E. detaching the deformed sheet of thermodeformable material from the printed circuit board.

6. The method of claim 1 wherein said sheet of deformable material comprises a sheet of bouncing putty and further comprising the step of deforming said sheet of bouncing putty by establishing a pressure differential between pressures on opposite sides of the sheet of bouncing putty.

7. A method for temporarily sealing holes in a printed circuit board during processing of the printed circuit board, said method comprising the steps of:
   A. placing a sheet of thermodeformable material on one side of a printed circuit board having holes therein;
   B. applying heat and force to said thermodeformable sheet material for sufficient time to deform said sheet material so that the material extends into each hole to form a protectively sealing plug therein;
   C. coating the other side of the printed circuit board with a process liquid;
   D. processing the printed circuit board; and, thereafter,
   E. detaching the deformed sheet of thermodeformable material from the printed circuit board.

8. The method of claim 7 further comprising the steps of repeating at least once steps (A) through (E) using the deformed sheet of thermodeformable material of step (E) as the thermodeformable sheet material of step (A).

9. The method of claims 7 or 8 wherein step (B) is performed in an inert environment.

10. The method of claims 7 or 8 further comprising the step of applying a release agent to the side of said sheet of thermodeformable material in contact with said printed circuit board or the surface of the printed circuit board itself before placing the sheet of thermodeformable material thereon.

11. The method of claims 7 or 8 wherein said sheet of thermodeformable material comprises a sheet of thermodeformable plastic and further comprising the step of raising the temperature of said sheet of thermodeformable plastic to at least its Vicat softening temperature.

12. The method of claim 11 wherein said sheet of thermodeformable plastic comprises a low density polyethylene.

13. The method of claim 11 wherein said sheet of thermodeformable plastic comprises a high density polyethylene.

14. The method of claim 11 wherein said sheet of thermodeformable plastic comprises a polypropylene.

15. The method of claims 7 or 8 further comprising the step of creating said force by establishing a pressure differential between pressures on opposite sides of the thermodeformable sheet material.

16. The method of claim 15 wherein said pressure differential is established by applying a vacuum to the other side of said printed circuit board.

17. The method of claims 7 or 8 wherein the thermodeformable sheet material is deformed so that each one of said protectively sealing plugs has a volumetric configuration corresponding to the volumetric configuration of the corresponding hole.

18. The method of claims 7 or 8 wherein each one of said protectively sealing plugs is hollow.

19. The method of claims 7 or 8 wherein the sheet of thermodeformable material is deformed so that each one of said protectively sealing plugs has a planar surface that is coplanar with the surface of the other side of said printed circuit board.

20. The method of claims 7 or 8 further comprising the steps of adhesively securing a relatively stiff sheet material to the thermodeformable sheet material to provide a backing support after Step B and prior to step (C) and detaching in Step E both the deformed sheet of thermodeformable material and the relatively stiff sheet material backing support from the printed circuit board.

21. A method for temporarily sealing holes in a printed circuit board during processing of the printed circuit board, said method comprising the steps of:
   A. placing a sandwich comprising:
      (i) a first component having a first melting point, said first component comprising a sheet of thermodeformable material;
      (ii) a second component having a second melting point, said second component comprising a thermally conductive sheet material of substantially the same size and shape as said sheet of thermodeformable material and being secured thereto around the periphery thereof whereby said first and second components define a sealed cavity therebetween;
      (iii) a third component having a third melting point, said third component occupying at least a portion of the sealed cavity and constituting a heat transfer medium between said first and second components with said third component having the lowest melting point and the second component having the highest melting point and the first component having a melting point in between said second and third melting points; on one side of the printed circuit board having holes therein with the first component sheet of thermodeformable material in contact with said one side of the printed circuit board;
   B. applying sufficient heat and force to the second component sheet material to raise the temperature of the third component to the third melting point whereby the heat and force are transferred to said first component thermodeformable sheet material for sufficient time to deform the material so that the material extends into each hole to form a protective sealing plug therein;
   C. reducing the temperature of the third component below the third melting point;
   D. coating the other side of the printed circuit board with a process liquid;

E. processing the printed circuit board; and, thereafter,

F. detaching the first component deformed sheet of thermodeformable material from the printed circuit board.

22. The method of claim 21 further comprising the steps of repeating at least once steps (A) through (F) using the deformed sheet of thermodeformable material of step (F) as the first component thermodeformable sheet material of step (A)(i).

23. The method of claims 21 or 22 further comprising the step of applying a release agent to the side of said first component sheet of thermodeformable material in contact with said printed circuit board or the surface of the printed circuit board itself before placing the sheet of thermodeformable material thereon.

24. The method of claims 21 or 22 wherein said first component sheet of thermodeformable material comprises a sheet of thermodeformable plastic and further comprising the step of raising the temperature of said sheet of thermodeformable plastic to at least its Vicat softening temperature.

25. The method of claim 24 wherein said sheet of thermodeformable plastic comprises a low density polyethylene.

26. The method of claim 24 wherein said sheet of thermodeformable plastic comprises a high density polyethylene.

27. The method of claim 24 wherein said sheet of thermodeformable plastic comprises a polypropylene.

28. A method for temporarily sealing holes in a printed circuit board during processing of the printed circuit board, said method comprising the steps of:

A. forming a sandwich comprising:
(i) a first component having a melting point, said first component comprising a flexible, thermally conductive sheet material;
(ii) a second component having a melting point that is lower than the melting point of said first component, said second component comprising a sheet of thermodeformable material;
(iii) a printed circuit board having holes therein, said printed circuit board being positioned with the second component sheet of thermodeformable material in contact with one side of the printed circuit board and covering at least some of said holes;
(iv) a compressible porous release sheet positioned in contact with the other side of the printed circuit board;
(v) a flat, porous plate positioned in contact with said porous release sheet, and
with said first component flexible thermally conductive sheet material being sealed around the periphery thereof to a vacuum table to define a chamber within which are located in sandwiched relation the second component thermodeformable sheet material, the printed circuit board, the compressible porous release sheet and the flat, porous plate with said flat, porous plate being fixed with respect to said vacuum table;

B. drawing a vacuum through the flat, porous plate to evacuate the chamber defined by said first component, flexible thermally conductive sheet material and said vacuum table so that: (i) the first component flexible, thermally conductive sheet material is forced into thermally conductive contact with said second component thermally deformable sheet material; (ii) the second component thermodeformable sheet material is forced against the printed circuit board; and, (iii) the printed circuit board is forced against and compresses said compressible porous release sheet against the flat, porous plate;

C. applying sufficient heat to the first component thermally conductive sheet material to raise the temperature of the second component thermodeformable sheet material so that it deforms under the heat and the vacuum created force and extends into each one of said at least some holes to form a protective sealing plug therein with the deformation occurring without thermally stressing the printed circuit board;

D. reducing the temperature of the second component thermodeformable sheet material and terminating the vacuum established in Step B;

E. removing said compressible porous release sheet from the other side of the printed circuit board;

F. coating the other side of the printed circuit board with a process liquid;

G. processing the printed circuit board; and, thereafter,

H. detaching the second component deformed sheet of thermodeformable material from the printed circuit board.

29. The method of claim 28 further comprising the steps of repeating at least once steps (A) through (H) using the deformed sheet of thermodeformable material of step (H) as the second component thermodeformable sheet material of step (A)(ii).

30. The method of claims 28 or 29 wherein said second component sheet of thermodeformable material comprises a sheet of thermodeformable plastic and further comprising the step of raising the temperature of said sheet of thermodeformable plastic to at least its Vicat softening temperature.

31. The method of claim 30 wherein said sheet of thermodeformable plastic comprises a low density polyethylene.

32. The method of claim 30 wherein said sheet of thermodeformable plastic comprises a high density polyethylene.

33. The method of claim 30 wherein said sheet of thermodeformable plastic comprises a polypropylene.

34. The method of claims 28 or 29 further comprising the step of applying a release agent to the side of said second component sheet of thermodeformable material in contact with said printed circuit board or the surface of the printed circuit board itself before placing the sheet of thermodeformable material thereon.

35. The method of claims 28 or 29 wherein the sandwich is formed with a third component comprising a flexible, thermally conductive sheet material having a melting point higher than the melting point of the second component thermally deformable sheet material, said third component sheet material being placed in sandwiched relation between the first component sheet material and said second component thermally deformable sheet material so that when the vacuum is drawn in Step B, the first component flexible, thermally conductive sheet material is forced into thermally conductive contact with the third component thermally conductive sheet material which in turn is forced into thermally conductive contact with said second component thermally deformable sheet material, the second component thermodeformable sheet material is forced against the printed circuit board and the printed circuit board is forced against and compresses said compressible porous release sheet against the flat, porous plate.

36. The method of claim 35 wherein said third component thermally conductive sheet material extends beyond the perimeter of the second component thermally deformable sheet material whereby said second component thermally deformable sheet material is prevented from physically contacting said first component thermally conductive sheet material during at least Steps B and C.

37. The method of claim 28 wherein the vacuum of Step B is drawn after the thermodeformable material is heated in Step C.

38. The method of claim 28 further comprising the step of applying an external force to said first component, flexible, thermally conductive sheet material (A(i)) after Step B and before Step C.

39. The method of claim 38 further comprising the step of eliminating Step B and applying the external force to said first component, flexible, thermally conductive sheet material (A(i)) after Step C.

40. The method of claim 28 further comprising the step of controlling the rate of heat transfer to the printed circuit board by using the thermodeformable sheet material as a regulating heat transfer medium.

41. A method for temporarily sealing holes in a printed circuit board during processing of the printed circuit board, said method comprising the steps of:
   A. forming a sandwich comprising:
      (i) a first component flexible sheet material;
      (ii) a second componet sheet of pressure-deformable material;
      (iii) a printed circuit board having holes therein, said printed circuit board being positioned with the second component sheet of pressure-deformable material in contact with one side of the printed circuit board and covering at least some of said holes;
      (iv) a compressible porous release sheet positioned in contact with the other side of the printed circuit board;
      (v) a flat, porous plate positioned in contact with said porous release sheet, and
   with said first component flexible sheet material being sealed around the periphery thereof to a vacuum table to define a chamber within which are located in sandwiched relation the second component pressure-deformable sheet material, the printed circuit board, the compressible porous release sheet and the flat, porous plate with said flat, porous plate being fixed with respect to said vacuum table;
   B. drawing a vacuum through the flat, porous plate to evacuate the chamber defined by said first component, flexible sheet material and said vacuum table so that: (i) the first component flexible sheet material is forced into contact with said second component pressure-deformable sheet material; (ii) the second component pressure-deformable sheet material is forced against the printed circuit board; and, (iii) the printed circuit board is forced against and compresses said compressible porous release sheet against the flat, porous plate whereby the second component pressure-deformable sheet material deforms under the vacuum created force and extends into each one of said at least some holes to form a protective sealing plug therein.
   C. terminating the vacuum established in Step B;
   D. removing said compressible porous release sheet from the other side of the printed circuit board;
   E. coating the other side of the printed circuit board with a process liquid;
   F. processing the printed circuit board; and, thereafter,
   G. detaching the second component deformed sheet of pressure-deformable material from the printed circuit board.

42. The method of claim 41 further comprising the steps of repeating at least once steps (A) through (G) using the deformed sheet of pressure-deformable material of step (G) as the second component pressure-deformable sheet material of step (A)(ii).

43. The method of claims 41 or 42 wherein the sandwich is formed with a third component comprising a flexible sheet material, said third component flexible sheet material being placed in sandwiched relation between the first component flexible sheet material and said second component pressure-deformable sheet material so that when the vacuum is drawn in Step B, the first component flexible, sheet material is forced into contact with the third component flexible sheet material which in turn is forced into contact with said second component pressure-deformable sheet material, the second component pressure-deformable sheet material is forced against the printed circuit board and the printed circuit board is forced against and compresses said compressible porous release sheet against the flat, porous plate.

44. The method of claim 43 wherein said third component flexible sheet material extends beyond the perimeter of the second component pressure-deformable sheet material whereby said second component pressure-deformable sheet material is prevented from physically contacting said first component flexible sheet material during at least Step B.

45. The method of claim 35 further comprising the step of using both second component deformed thermodeformable material and the third component flexible, thermally conductive sheet material again with the latter being used as the third component flexible, thermally conductive sheet material that is placed in sandwiched relation between the first and second component sheet materials.

46. The method of claims 1, 2, 41 or 42 further comprisng the step of applying a release agent to the side of said sheet of deformable material in contact with said printed circuit board or the surface of the printed circuit board itself before placing the sheet of deformable material thereon.

47. The method of claims 2 or 8 further comprising the step of using said printed circuit board again during the repetition of said steps.

48. The method of claims 2 or 8 further comprising the step of using another printed circuit board during the repetition of said steps.

49. The method of claims 1, 2, 3, 4, 5, 6, 7, 8, 21, 22, 28, 29, 37, 38, 39, 40, 41, 42, or 46 further comprising the step of appying a vacuum to the process liquid coated side of the printed circuit board to remove any gas entrapped in or under the process liquid coating.

50. The method of claim 49 further comprising the step of solidifying the process liquid coating.

51. The method of claim 50 wherein the process liquid coating is solidified by drying.

52. The method of claim 51 further comprising the step of drying the process liquid coating in a vacuum.

53. The method of claim 50 wherein the process liquid coating is solidified by curing.

54. The method of claim 53 further comprising the step of selectively curing the process liquid with selective exposure to electro-magnetic radiation.

55. The method of claims 1, 2, 3, 4, 5, 6, 7, 8, 21, 22, 28, 29, 37, 38, 39, 40, 41, 42, or 46 further comprising the step of flattening the printed circuit board by placing the deformed thermodeformable material side of the printed circuit board in contact with a flat vacuum table and applying a vacuum thereto before coating the other side of the printed circuit board with said process liquid.

56. The method of claims 28 or 41 wherein the compressible porous release sheet comprises a sheet of paper that is positioned between the printed circuit board and the flat, porous plate of the vacuum table.

57. The method of claim 29 wherein the compressible porous release sheet comprises a sheet of paper that is positioned between the printed circuit board and the flat, porous plate and further comprising the step of using a new sheet of paper each time that steps (A) through (H) are performed.

58. The method of claim 42 wherein the compressible porous release sheet comprises a sheet of paper that is positioned between the printed circuit board and the flat, porous plate and further comprising the step of using a new sheet of paper each time that steps (A) through (G) are performed.

59. A method for temporarily sealing a printed circuit board during processing of the printed circuit board, said method comprising the steps of:
   A. placing a sheet of thermodeformable plastic on one side of a printed circuit board;
   B. applying sufficient heat and force to said thermodeformable plastic sheet to raise the temperature of the plastic sheet to at least its VICAT softening temperature for sufficient time to deform said plastic sheet so that it conforms to the surface topography of the printed circuit board with said thermodeformable plastic sheet distributing the heat to the printed circuit board and regulating the rate of the heat transfer thereto;
   C. processing the printed circuit board; and, thereafter,
   D. detaching the deformed sheet of thermodeformable plastic from the printed circuit board.

60. The method of claim 59 further comprising the steps of repeating at least once steps (A) through (D) using the deformed sheet of thermodeformable plastic of step (D) as the thermodeformable plastic sheet of step (A).

61. The method of claims 59 or 60 wherein step (B) is performed in an inert environment.

62. The method of claims 59 or 60 further comprising the step of applying a release agent to the side of said sheet of thermodeformable plastic in contact with said printed circuit board or the surface of the printed circuit board itself before placing the sheet of thermodeformable plastic thereon.

63. The method of claims 59 or 60 wherein said sheet of thermodeformable plastic comprises a low density polyethylene.

64. The method of claims 59 or 60 wherein said sheet of thermodeformable plastic comprises a high density polyethylene.

65. The method of claims 59 or 60 wherein said sheet of thermodeformable plastic comprises a polypropylene.

66. The method of claims 59 or 60 further comprising the step of creating said force by establishing a pressure differential between pressures on opposite sides of the thermodeformable sheet material.

67. The method of claim 66 wherein said pressure differential is established by applying a vacuum to the other side of said printed circuit board.

68. The method of claims 59 or 60 further comprising the step of using said printed circuit board again during the repetition of said steps.

69. The method of claims 59 or 60 further comprising the step of using another printed circuit board during the repetition of said steps.

70. The method of claims 59 or 60 further comprising the step of flattening the printed circuit board by placing the deformed thermodeformable material side of the printed circuit board in contact with a flat vacuum table and applying a vacuum thereto before processing the other side of the printed circuit board.

71. The method of claim 23 further comprising the step of using said printed circuit board again during the repetition of the steps.

72. The method of claim 29 further comprising the step of using said printed circuit board again during the repetition of the steps.

73. The method of claim 42 further comprising the step of using said printed circuit board again during the repetition of the steps.

74. The method of claim 23 further comprising the step of using another printed circuit board during the repetition of said steps.

75. The method of claim 29 further comprising the step of using another printed circuit board during the repetition of said steps.

76. The method of claim 42 further comprising the step of using another printed circuit board during the repetition of said steps.

77. The method of claims 8, 22 or 29 wherein the deformed sheet of thermodeformable material of steps (E), (F) and (H), respectively, is placed on said one side of the printed circuit board with the sealing plugs facing said one side.

78. The method of claim 60 wherein the deformed sheet of thermodeformable plastic of step (D) is placed on said one side of the printed circuit board with the sealing plugs facing said one side.

79. A method for temporarily sealing holes in a printed circuit board during processing of the printed circuit board; said method comprising the steps of:
   A. placing a sheet of deformable material on one side of a printed circuit board having holes therein;
   B. deforming said sheet material so that the material extends into each hole to form a protectively sealing plug therein;
   C. coating the other side of the printed circuit board with a process liquid;
   D. applying a vacuum to the process liquid coated side of the printed circuit board to remove any gas entrapped in or under the process liquid coating;
   E. solidifying the process liquid coating;
   F. detaching the deformed sheet material from the printed circuit board;
   G. placing a sheet of deformable material on the solidified process liquid coated side of the printed circuit board having holes therein;
   H. deforming the sheet of deformable material so that the material extends into each hole to form a protectively sealing plug therein;

I. coating the non-process liquid coated other side of the printed circuit board with a process liquid;
J. applying a vacuum to the now process liquid coated other side of the printed circuit board to remove any gas entrapped in or under the process liquid coating;
K. solidifying the process liquid coating; and,
L. detaching the deformed sheet material from the printed circuit board.

80. A method for temporarily sealing holes in a printed circuit board during processing of the printed circuit board, said method comprising the steps of:
A. placing a sheet of thermodeformable material on one side of a printed circuit board having holes therein;
B. applying heat and force to said thermodeformable sheet material for sufficient time to deform said sheet material so that the material extends into each hole to form a protectively sealing plug therein;
C. coating the other side of the printed circuit board with a process liquid;
D. applying a vacuum to the process liquid coated side of the printed circuit board to remove any gas entrapped in or under the process liquid coating;
E. solidifying the process liquid coating;
F. detaching the deformed sheet of thermodeformable material from the printed circuit board;
G. placing a sheet of thermodeformable material on the solidified process liquid coated side of the printed circuit board having holes therein;
H. applying heat and force to said thermodeformable sheet material for sufficient time to deform said sheet material so that the material extends into each hole to form a protectively sealing plug therein;
I. coating the non-process liquid coated other side of the printed circuit board with a process liquid;
J. applying a vacuum to the now process liquid coated other side of the printed circuit board to remove any gas entrapped in or under the process liquid coating;
K. solidifying the process liquid coating; and,
L. detaching the deformed sheet of thermodeformable material from the printed circuit board.

81. A method for temporarily sealing holes in a printed circuit board during processing of the printed circuit board, said method comprising the steps of:
A. forming a sandwich comprising:
(i) a first component flexible sheet material;
(ii) a second component sheet of pressure-deformable material;
(iii) a printed circuit board having holes therein, said printed circuit board being positioned with the second component sheet of pressure-deformable material in contact with one side of the printed circuit board and covering at least some of said holes;
(iv) a compressible porous release sheet positioned in contact with the other side of the printed circuit board;
(v) a flat, porous plate positioned in contact with said porous release sheet, and
with said first component flexible sheet material being sealed around the periphery thereof to a vacuum table to define a chamber within which are located in sandwiched relation the second component pressure-deformable sheet material, the printed circuit board, the compressible porous release sheet and the flat, porous plate with said flat, porous plate being fixed with respect to said vacuum table;
B. drawing a vacuum through the flat, porous plate to evacuate the chamber defined by said first component, flexible sheet material and said vacuum table so that: (i) the first component flexible sheet material is forced into contact with said second component pressure-deformable sheet material; (ii) the second component pressure-deformable sheet material is forced against the printed circuit board; and, (iii) the printed circuit board is forced against and compresses said compressible porous release sheet against the flat, porous plate whereby the second component pressure-deformable sheet material deforms under the vacuum created force and extends into each one of said at least some holes to form a protective sealing plug therein.
C. terminating the vacuum established in Step B;
D. removing said compressible porous release sheet from the other side of the printed circuit board;
E. coating the other side of the printed circuit board with a process liquid;
F. applying a vacuum to the process liquid coated side of the printed circuit board to remove any gas entrapped in or under the process liquid coating;
G. solidifying the process liquid coating;
H. detaching the second component deformed sheet of pressure-deformable material from the printed circuit board;
I. forming another sandwich comprising:
(i) a first component flexible sheet material;
(ii) a second component sheet of pressure-deformable material;
(iii) the printed circuit board having holes therein, said printed circuit board being positioned with the second component sheet of pressure-deformable material in contact with the solidified process liquid coated side of the printed circuit board and covering at least some of said holes;
(iv) a compressible porous release sheet positioned in contact with the non-process liquid coated other side of the printed circuit board;
(v) a flat, porous plate positioned in contact with said porous release sheet, and
with said first component flexible sheet material being sealed around the periphery thereof to a vacuum table to define a chamber within which are located in sandwiched relation the second component pressure-deformable sheet material, the printed circuit board, the compressible porous release sheet and the flat, porous plate with said flat, porous plate being fixed with respect to said vacuum table;
J. drawing a vacuum through the flat, porous plate to evacuate the chamber defined by said another sandwich first component, flexible sheet material and said vacuum table so that: (i) the first component flexible sheet material is forced into contact with said second component pressure-deformable sheet material; (ii) the second component pressure-deformable sheet material is forced against the printed circuit board; and, (iii) the printed circuit board is forced against and compresses said compressible porous release sheet against the flat, porous plate whereby the second component pressure-deformable sheet material deforms under the vacuum created force and extends into each one of said at least some holes to form a protective sealing plug therein;

K. terminating the vacuum established in Step J;
L. removing said compressible porous release sheet from the non-process liquid coated other side of the printed circuit board;
M. coating the non-process liquid coated other side of the printed circuit board with a process liquid;
N. applying a vacuum to the now process liquid coated other side of the printed circuit board to remove any gas entrapped in or under the process liquid coating;
O. solidifying the process liquid coating; and,
P. detaching the second component deformed sheet of pressure-deformable material from the printed circuit board.

82. A method for temporarily sealing holes in a printed circuit board during processing of the printed circuit board, said method comprising the steps of:
A. placing a sandwich comprising:
  (i) a first component having a first melting point, said first component comprising a sheet of thermodeformable material;
  (ii) a second component having a second melting point, said second component comprising a thermally conductive sheet material of substantially the same size and shape as said sheet of thermodeformable material and being secured thereto around the periphery thereof whereby said first and second components define a sealed cavity therebetween;
  (iii) a third component having a third melting point, said third component occupying at least a portion of the sealed cavity and constituting a heat transfer medium between said first and second components with said third component having the lowest melting point and the second component having the highest melting point and the first component having a melting point in between said second and third melting points;
  on one side of the printed circuit board having holes therein with the first component sheet of thermodeformable material in contact with said one side of the printed circuit board;
B. applying sufficient heat and force to the second component sheet material to raise the temperature of the third component to the third melting point whereby the heat and force are transferred to said first component thermodeformable sheet material for sufficient time to deform the material so that the material extends into each hole to form a protective sealing plug therein;
C. reducing the temperature of the third component below the third melting point;
D. coating the other side of the printed circuit board with a process liquid;
E. applying a vacuum to the process liquid coated side of the printed circuit board to remove any gas entrapped in or under the process liquid coating;
F. solidifying the process liquid coating;
G. detaching the first component deformed sheet of thermodeformable material from the printed circuit board;
H. placing another sandwich comprising:
  (i) a first component having a first melting point, said first component comprising a sheet of thermodeformable material;
  (ii) a second component having a second melting point, said second component comprising a thermally conductive sheet material of substantially the same size and shape as said sheet of thermodeformable material and being secured thereto around the periphery thereof whereby said first and second components define a sealed cavity therebetween;
  (iii) a third component having a third melting point, said third component occupying at least a portion of the sealed cavity and constituting a heat transfer medium between said first and second components with said third component having the lowest melting point and the second component having the highest melting point and the first component having a melting point in between said second and third melting points;
  on the solidified process liquid coated side of the printed circuit board having holes therein with the first component sheet of thermodeformable material in contact with the solidified process liquid coated side of the printed circuit board;
I. applying sufficient heat and force to the second component sheet material to raise the temperature of the third component to the third melting point whereby the heat and force are transferred to said first component thermodeformable sheet material for sufficient time to deform the material so that the material extends into each hole to form a protective sealing plug therein;
J. reducing the temperature of the third component below the third melting point;
K. coating the non-process liquid coated other side of the printed circuit board with a process liquid;
L. applying a vacuum to the now process liquid coated other side of the printed circuit board to remove any gas entrapped in or under the process liquid coating;
M. solidifying the process liquid coating; and,
N. detaching the first component deformed sheet of thermodeformable material from the printed circuit board.

83. A method for temporarily sealing holes in a printed circuit board during processing of the printed circuit board, said method comprising the steps of:
A. forming a sandwich comprising:
  (i) a first component having a melting point, said first component comprising a flexible, thermally conductive sheet material;
  (ii) a second component having a melting point that is lower than the melting point of said first component, said second component comprising a sheet of thermodeformable material;
  (iii) a printed circuit board having holes therein, said printed circuit board being positioned with the second component sheet of thermodeformable material in contact with one side of the printed circuit board and covering at least some of said holes;
  (iv) a compressible porous release sheet positioned in contact with the other side of the printed circuit board;
  (v) a flat, porous plate positioned in contact with said porous release sheet, and
  with said first component flexible thermally conductive sheet material being sealed around the periphery thereof to a vacuum table to define a chamber within which are located in sandwiched relation the second component thermodeformable sheet material, the printed circuit board, the compressible porous release sheet and the flat, porous plate with said flat, porous plate being fixed with respect to said vacuum table;

B. drawing a vacuum through the flat, porous plate to evacuate the chamber defined by said first component, flexible thermally conductive sheet material and said vacuum table so that: (i) the first component flexible, thermally conductive sheet material is forced into thermally conductive contact with said second component thermally deformable sheet material; (ii) the second component thermodeformable sheet material is forced against the printed circuit board; and, (iii) the printed circuit board is forced against and compresses said compressible porous release sheet against the flat, porous plate;

C. applying sufficient heat to the first component thermally conductive sheet material to raise the temperature of the second component thermodeformable sheet material so that it deforms under the heat and the vacuum created force and extends into each one of said at least some holes to form a protective sealing plug therein with the deformation occurring without thermally stressing the printed circuit board;

D. reducing the temperature of the second component thermodeformable sheet material and terminating the vacuum established in Step B;

E. removing said compressible porous release sheet from the other side of the printed circuit board;

F. coating the other side of the printed circuit board with a process liquid;

G. applying a vacuum to the process liquid coated side of the printed circuit board to remove any gas entrapped in or under the process liquid coating;

H. solidifying the process liquid coating;

I. detaching the second component deformed sheet of thermodeformable material from the printed circuit board;

J. forming another sandwich comprising:
  (i) a first component having a melting point, said first component comprising a flexible, thermally conductive sheet material;
  (ii) a second component having a melting point that is lower than the melting point of said first component, said second component comprising a sheet of thermodeformable material;
  (iii) a printed circuit board having holes therein, said printed circuit board being positioned with the second component sheet of thermodeformable material in contact with the solidified process liquid coated side of the printed circuit board and covering at least some of said holes;
  (iv) a compressible porous release sheet positioned in contact with the non- process liquid coated other side of the printed circuit board;
  (v) a flat, porous plate positioned in contact with said porous release sheet, and with said first component flexible thermally conductive sheet material being sealed around the periphery thereof to a vacuum table to define a chamber within which are located in sandwiched relation the second component thermodeformable sheet material, the printed circuit board, the compressible porous release sheet and the flat, porous plate with said flat, porous plate being fixed with respect to said vacuum table;

K. drawing a vacuum through the flat, porous plate to evacuate the chamber defined by said another sandwich first component, flexible thermally conductive sheet material and said vacuum table so that: (i) the first component flexible, thermally conductive sheet material is forced into thermally conductive contact with said second component thermally deformable sheet material; (ii) the second component thermodeformable sheet material is forced against the printed circuit board; and, (iii) the printed circuit board is forced against and compresses said compressible porous release sheet against the flat, porous plate;

L. applying sufficient heat to the first component thermally conductive sheet material to raise the temperature of the second component thermodeformable sheet material so that it deforms under the heat and the vacuum created force and extends into each on of said at least some holes to form a protective sealing plug therein with the deformation occurring without thermally stressing the printed circuit board;

M. reducing the temperature of the second component thermodeformable sheet material and terminating the vacuum established in Step K;

N. removing said compressible porous release sheet from the non-process liquid coated other side of the printed circuit board;

O. coating the non-process liquid coated other side of the printed circuit board with a process liquid;

P. applying a vacuum to the now process liquid coated other side of the printed circuit board to remove any gas entrapped in or under the process liquid coating;

Q. solidifying the process liquid coating; and,

R. detaching the second component deformed sheet of thermodeformable material from the printed circuit board.

84. A method for temporarily sealing holes in a printed circuit board during processing of the printed circuit board, said method comprising the steps of:
  A. placing a sheet of thermodeformable material on one side of a printed circuit board having holes therein;
  B. deforming said thermodeformable sheet material at least in part by applying heat to the thermodeformable sheet material for sufficient time so that the material extends into each hole to form a protectively sealing plug therein;
  C. processing the printed circuit board; and, thereafter,
  D. detaching the deformed sheet of thermodeformable material from the printed circuit board 85. A method for temporarily sealing holes in a printed circuit board during processing of the printed circuit board, said method comprising the steps of:
  A. placing a sheet of thermodeformable material on one side of a printed circuit board having holes therein;
  B. applying heat and force to said thermodeformable sheet material for sufficient time to deform said sheet material so that the material extends into each hole to form a protectively sealing plug therein;
  C. processing the printed circuit board; and, thereafter,
  D. detaching the deformed sheet of thermodeformable material from the printed circuit board.

86. The method of claim 85 further comprising the steps of repeating at least once steps (A) through (D) using the deformed sheet of thermodeformable material of step (D) as the thermodeformable sheet material of step (A).

87. A method for temporarily sealing holes in a printed circuit board during procesing of the printed circuit board, said method comprising the steps of:

A. placing a sandwich comprising:
 (i) a first component having a first melting point, said first component comprising a sheet of thermodeformable material;
 (ii) a second component having a second melting point, said second component comprising a thermally conductive sheet material of substantially the same size and shape as said sheet of thermodeformable material and being secured thereto around the periphery thereof whereby said first and second components define a sealed cavity therebetween;
 (iii) a third component having a third melting point, said third component occupying at least a portion of the sealed cavity and constituting a heat transfer medium between said first and second components with said third component having the lowest melting point and the second component having the highest melting point and the first component having a melting point in between said second and third melting points;
 on one side of the printed circuit board having holes therein with the first component sheet of thermodeformable material in contact with said one side of the printed circuit board;
B. applying sufficient heat and force to the second component sheet material to raise the temperature of the third component to the third melting point whereby the heat and force are transferred to said first component thermodeformable sheet material for sufficient time to deform the material so that the material extends into each hole to form a protective sealing plug therein;
C. reducing the temperature of the third component below the third melting point;
D. processing the printed circuit board; and, thereafter,
E. detaching the first component deformed sheet of thermodeformable material from the printed circuit board.

88. The method of claim 84 further comprising the steps of repeating at least once steps (A) through (E) using the deformed sheet of thermodeformable material of step (E) as the first component thermodeformable sheet material of step (A)(i).

89. A method for temporarily sealing holes in a printed circuit board during processing of the printed circuit board, said method comprising the steps of:

A. forming a sandwich comprising:
 (i) a first component having a melting point, said first component comprising a flexible, thermally conductive sheet material;
 (ii) a second component having a melting point that is lower than the melting point of said first component, said second component comprising a sheet of thermodeformable material;
 (iii) a printed circuit board having holes therein, said printed circuit board being positioned with the second component sheet of thermodeformable material in contact with one side of the printed circuit board and covering at least some of said holes;
 (iv) a compressible porous release sheet positioned in contact with the other side of the printed circuit board;
 (v) a flat, porous plate positioned in contact with said porous release sheet, and
 with said first component flexible thermally conductive sheet material being sealed around the periphery thereof to a vacuum table to define a chamber within which are located in sandwiched relation the second component thermodeformable sheet material, the printed circuit board, the compressible porous release sheet and the flat, porous plate with said flat, porous plate being fixed with respect to said vacuum table;
B. drawing a vacuum through the flat, porous plate to evacuate the chamber defined by said first component, flexible thermally conductive sheet material and said vacuum table so that: (i) the first component flexible, thermally conductive sheet material is forced into thermally conductive contact with said second component thermally deformable sheet material; (ii) the second component thermodeformable sheet material is forced against the printed circuit board; and, (iii) the printed circuit board is forced against and compresses said compressible porous release sheet against the flat, porous plate;
C. applying sufficient heat to the first component thermally conductive sheet material to raise the temperature of the second component thermodeformable sheet material so that it deforms under the heat and the vacuum created force and extends into each one of said at least some holes to form a protective sealing plug therein with the deformation occurring without thermally stressing the printed circuit board;
D. reducing the temperature of the second component thermodeformable sheet material and terminating the vacuum established in Step B;
E. removing said compressible porous release sheet from the other side of the printed circuit board;
F. processing the printed circuit board; and, thereafter,
G. detaching the second component deformed sheet of thermodeformable material from the printed circuit board.

90. The method of claim 89 further comprising the steps of repeating at least once steps (A) through (G) using the deformed sheet of thermodeformable material of step (G) as the second component thermodeformable sheet material of step (A)(ii).

91. A method for temporarily sealing holes in a printed circuit board during processing of the printed circuit board, said method comprising the steps of:

A. placing a sheet of deformable material on one side of a printed circuit board having holes therein;
B. deforming said sheet material so that the material extends into each hole to form a protectively sealing plug therein;
C. detaching the deformed sheet material from the printed circuit board; and thereafter,
D. utilizing said deformed sheet material as a three dimensional replica of said printed circuit board.

92. The method of claim 91 wherein said utilization comprises comparing the geometry of the three dimensional replica with the geometry specified for the printed circuit board.

93. A method for temporarily sealing holes in a printed circuit board during processing of the printed circuit board, said method comprising the steps of:
- A. placing a sheet of thermodeformable material on one side of a printed circuit board having holes therein;
- B. deforming said thermodeformable sheet material at least in part by applying heat to the thermodeformable sheet material for sufficient time so that the material extends into each hole to form a protectively sealing plug therein;
- C. detaching the deformed sheet of thermodeformable material from the printed circuit board; and, thereafter,
- D. utilizing said deformed sheet of thermodeformable material as a three dimensional replica of said printed circuit board.

94. The method of claim 93 wherein said utilization comprises comparing the geometry of the three dimensional replica with the geometry specified for the printed circuit board.

95. A method for temporarily sealing holes in a printed circuit board during processing of the printed circuit board, said method comprising the steps of:
- A. placing a sheet of thermodeformable material on one side of a printed circuit board having holes therein;
- B. applying heat and force to said thermodeformable sheet material for sufficient time to deform said sheet material so that the material extends into each hole to form a protectively sealing plug therein;
- C. detaching the deformed sheet of thermodeformable material from the printed circuit board; and, thereafter;
- D. utilizing said deformed sheet of thermodeformable material as a three dimensional replica of said printed circuit board.

96. The method of claim 95 wherein said utilization comprises comparing the geometry of the three dimensional replica with the geometry specified for the printed circuit board.

97. A method for temporarily sealing holes in a printed circuit board during procesing of the printed circuit board, said method comprising the steps of:
- A. placing a sandwich comprising:
  - (i) a first component having a first melting point, said first component comprising a sheet of thermodeformable material;
  - (ii) a second component having a second melting point, said second component comprising a thermally conductive sheet material of substantially the same size and shape as said sheet of thermodeformable material and being secured thereto around the periphery thereof whereby said first and second components define a sealed cavity therebetween;
  - (iii) a third component having a third melting point, said third component occupying at least a portion of the sealed cavity and constituting a heat transfer medium between said first and second components with said third component having the lowest melting point and the second component having the highest melting point and the first component having a melting point in between said second and third melting points;

on one side of the printed circuit board having holes therein with the first component sheet of thermodeformable material in contact with said one side of the printed circuit board;
- B. applying sufficient heat and force to the second component sheet material to raise the temperature of the third component to the third melting point whereby the heat and force are transferred to said first component thermodeformable sheet material for sufficient time to deform the material so that the material extends into each hole to form a protective sealing plug therein;
- C. reducing the temperature of the third component below the third melting point;
- D. detaching the first component deformed sheet of thermodeformable material from the printed circuit board; and thereafter,
- E. utilizing said first component deformed sheet of thermodeformable material as a three dimensional replica of said printed circuit board.

98. The method of claim 97 wherein said utilization comprises comparing the geometry of the three dimensional replica with the geometry specified for the printed circuit board.

99. A method for temporarily sealing holes in a printed circuit board during procesing of the printed circuit board, said method comprising the steps of:
- A. forming a sandwich comprising:
  - (i) a first component having a melting point, said first component comprising a flexible, thermally conductive sheet material;
  - (ii) a second component having a melting point that is lower than the melting point of said first component, said second component comprising a sheet of thermodeformable material;
  - (iii) a printed circuit board having holes therein, said printed circuit board being positioned with the second component sheet of thermodeformable material in contact with one side of the printed circuit board and covering at least some of said holes;
  - (iv) a compressible porous release sheet positioned in contact with the other side of the printed circuit board;
  - (v) a flat, porous plate positioned in contact with said porous release sheet, and with said first component flexible thermally conductive sheet material being sealed around the periphery thereof to a vacuum table to define a chamber within which are located in sandwiched relation the second component thermodeformable sheet material, the printed circuit board, the compressible porous release sheet and the flat, porous plate with said flat, porous plate being fixed with respect to said vacuum table;
- B. drawing a vacuum through the flat, porous plate to evacuate the chamber defined by said first component, flexible thermally conductive sheet material and said vacuum table so that: (i) the first component flexible, thermally conductive sheet material is forced into thermally conductive contact with said second component thermally deformable sheet material; (ii) the second component thermodeformable sheet material is forced against the printed circuit board; and, (iii) the printed circuit board is forced against and compresses said compressible porous release sheet against the flat, porous plate;
- C. applying sufficient heat to the first component thermally conductive sheet material to raise the temperature of the second component thermodeformable sheet material so that it deforms under the heat and the vacuum created force and extends into each one of said at least some holes to form a protective sealing plug therein with the deformation occurring without thermally stressing the printed circuit board;

D. reducing the temperature of the second component thermodeformable sheet material and terminating the vacuum established in Step B;

E. removing said compressible porous release sheet from the other side of the printed circuit board;

F. detaching the second component deformed sheet of thermodeformable material from the printed circuit board; and, thereafter;

G. utilizing said second component deformed sheet of thermodeformable material as a three dimensional replica of said printed circuit board.

100. The method of claim 99 wherein said utilization comprises comparing the geometry of the three dimensional replica with the geometry specified for the printed circuit board.

101. A method for temporarily sealing a printed circuit board during processing of the printed circuit board, said method comprising the steps of:

A. placing a sheet of thermodeformable plastic on one side of a printed circuit board;

B. applying sufficient heat and force to said thermodeformable plastic sheet to raise the temperature of the plastic sheet to at least its VICAT softening temperature for sufficient time to deform said plastic sheet so that it conforms to the surface topography of the printed circuit board;

C. detaching the deformed sheet of thermodeformable plastic from the printed circuit board; and, thereafter D. utilizing said deformed sheet of thermodeformable plastic as a three dimensional replica of said printed circuit board.

102. The method of claim 101 wherein said utilization comprises comparing the geometry of the three dimensional replica with the geometry specified for the printed circuit board.

* * * * *